United States Patent
Choi et al.

(10) Patent No.: US 8,053,374 B2
(45) Date of Patent: Nov. 8, 2011

(54) METHOD OF MANUFACTURING A METAL WIRING STRUCTURE

(75) Inventors: Kyung-In Choi, Seoul (KR); Hyeon-Deok Lee, Seoul (KR); Gil-Heyun Choi, Seoul (KR); Jong-Myeong Lee, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 254 days.

(21) Appl. No.: 12/506,361

(22) Filed: Jul. 21, 2009

(65) Prior Publication Data

US 2010/0022086 A1    Jan. 28, 2010

(30) Foreign Application Priority Data

Jul. 23, 2008    (KR) .................. 10-2008-0071449

(51) Int. Cl.
*H01L 21/31* (2006.01)
*H01L 21/469* (2006.01)
*H01L 21/4763* (2006.01)

(52) U.S. Cl. .. 438/775; 438/618; 438/627; 257/E21.584

(58) Field of Classification Search .................. 438/775, 438/618, 627; 257/E21.584

See application file for complete search history.

(56) References Cited

U.S. PATENT DOCUMENTS 6,159,851 A * 12/2000 Chen et al. .................... 438/669
2005/0245065 A1* 11/2005 Motoyama .................... 438/618

FOREIGN PATENT DOCUMENTS

JP    2000-235962    8/2000
KR    1020060041408 A    5/2006

* cited by examiner

*Primary Examiner* — Alexander Ghyka
*Assistant Examiner* — Seahvosh Nikmanesh
(74) *Attorney, Agent, or Firm* — Volentine & Whitt, PLLC

(57) ABSTRACT

In a method of manufacturing a metal wiring structure, a first metal wiring and a first barrier layer are formed on a substrate, and the first barrier layer is nitridated. An insulating interlayer is formed on the substrate so as to extend over the first metal wiring and the first barrier layer. Part of the insulating interlayer is removed to form a hole exposing at least part of the first metal wiring and part of the first barrier layer. A nitridation plasma treatment is performed on the exposed portion of the first barrier layer. A second barrier layer is formed along the bottom and sides of the hole. A plug is formed on the second barrier layer to fill the hole.

11 Claims, 22 Drawing Sheets

METHOD OF MANUFACTURING A METAL WIRING STRUCTURE

BACKGROUN

1. Field

Example embodiments relate to a method of manufacturing a metal wiring structure of a semiconductor device or the like. More particularly, example embodiments relate to a method of manufacturing a metal wiring structure including a metal wiring and a plug connected to the metal wiring.

2. Description of the Related Art

As semiconductor devices become highly integrated, the footprints occupied by elements of the devices must be made smaller. For example, wirings and plugs connected to the wirings of semiconductor devices must become narrower if the degree of integration is to be increased. However, the resistance of the wirings and the plugs increases as the widths of the wirings and plugs decrease. Thus, it is difficult to manufacture a highly integrated semiconductor device which operates at a high speed and consumes a low amount of power.

In order to overcome such a limitation, a wiring of a semiconductor device, including a lower level wiring, is often fabricated from copper which has a relatively low resistance. The plugs are generally fabricated from tungsten. When a copper wiring and a tungsten plug are formed, a first barrier layer surrounding the copper wiring and a second barrier layer surrounding the tungsten plug are formed. In this case, elements of the first and second barrier layers can react with each other resulting in corrosion of the first or second barrier layers.

SUMMARY

Example embodiments provide a method of manufacturing a metal wiring structure including a metal wiring and a plug, which prevents a first barrier layer of the metal wiring from corroding.

According to some example embodiments, there is provided a method of manufacturing a metal wiring structure in which a first metal wiring and a first barrier layer are formed on a substrate, and the first barrier layer is nitridated to improve its corrosion-resistance.

According to some example embodiments, there is provided a method of manufacturing a metal wiring structure in which a first metal wiring and a first barrier layer of a metal nitride are formed on a substrate, and the nitrogen content of the metal nitride of the first barrier layer is increased to improve its corrosion-resistance.

An insulating interlayer is formed over the first metal wiring and the first barrier layer, and a hole for a contact plug is formed in the insulating interlayer. The hole exposes at least part of each of the first metal wiring and the first barrier layer. At this time,-a plasma treatment is performed on the exposed portion of the first barrier layer to nitridate the first barrier layer. Then, a second barrier layer is formed along the bottom and sides of the hole. A plug is formed on the second barrier layer to fill the hole.

The first metal wiring may be formed of copper, aluminum, gold, or silver. In the case in which the first metal wiring is formed of copper, and the first barrier layer is formed of titanium nitride or tantalum nitride.

The first barrier layer may be formed by a chemical vapor deposition (CVD) process or an atomic layer deposition (ALD) process.

The plug may be formed of tungsten, and the second barrier layer may be a layer of tungsten nitride.

The second barrier layer may be formed by an ALD process, a sequential flow deposition (SFD) process, or a pulsed nucleation layer (PNL) process. In these processes, the source gas may comprise tungsten hexafluoride and ammonia.

The plasma treatment may be performed using a gas which contains hydrogen in addition to nitrogen. In this case, in addition to nitridating the first metal wiring, a natural oxide layer on the first metal wiring can be reduced.

Also, a cleaning process using a gas including argon and hydrogen may be performed before or after the plasma treatment.

According to some example embodiments, after forming a first barrier layer surrounding a metal wiring, a nitridation plasma treatment is performed on the first barrier layer. Thus, even though e.g., fluorine is generated when a second barrier layer surrounding a plug is formed, the first barrier layer may not be reacted with fluorine, so that corrosion of the first barrier may be prevented.

BRIEF DESCRIPTION OF THE DRAWINGS

These and other objects, features and advantages of the present invention will be more clearly understood from the following detailed description of the preferred embodiments, i.e., non-limiting examples, of the invention made in conjunction with the accompanying drawings. In the drawings.

DETAILED DESCRIPTION OF THE PREFERRED EMBODIMENTS

Figure 1:
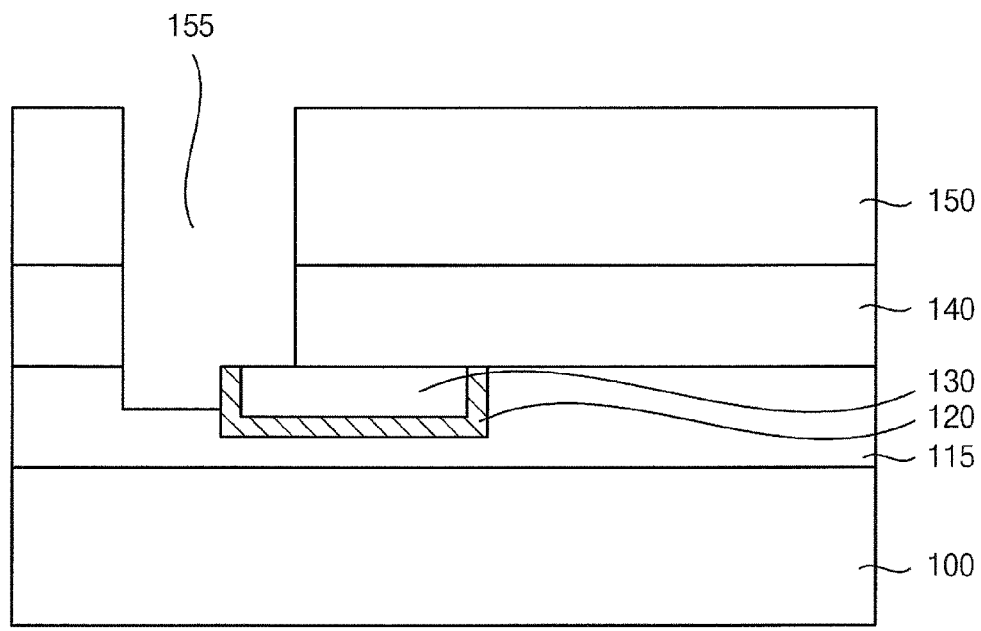
FIGS. 1 to 4 are cross-sectional views of a substrate and together illustrate an embodiment of a method of manufacturing a metal wiring structure.

Example embodiments will be described more fully hereinafter with reference to the accompanying drawings. In the drawings, the shapes, sizes and relative sizes of layers and regions may be exaggerated for clarity. Furthermore, like reference numerals designate like elements throughout the drawings.

A method of manufacturing a metal wiring structure in accordance with example embodiments will now be described with reference to FIGS. 1 to 4.

Referring to FIG. 1, a first insulating interlayer 115 is formed on a semiconductor substrate 100. The semiconductor substrate 100 may have an isolation layer, a source/drain region, a gate electrode, a capacitor, etc. The first insulating interlayer 115 may be formed by a chemical vapor deposition (CVD) process using a low-k material.

A first barrier layer 120 is formed on the first insulating interlayer 115. The first barrier layer 120 can be formed by removing part of the first insulating interlayer 115 to form an opening (not shown) and depositing a metal or a metal nitride on those surfaces of the first insulating layer 115 which define the bottom and sidewall of the opening. For example, the first barrier layer 120 may be formed by a sputtering process using tantalum, titanium, tantalum nitride, or titanium nitride. In the present embodiment, the first barrier layer 120 is formed to a thickness of about 100 to about 300 Å. When the first barrier layer 120 includes a large amount of nitride, the first barrier layer 120 will have high resistance to corroding. When the first barrier layer 120 includes a small amount of nitride, the first barrier layer 120 will strongly adhere to a first metal wiring 130 subsequently formed.

The first barrier layer 120 prevents a metal component of the first metal wiring 130 from diffusing into the first insulating interlayer 115. Additionally, the first barrier layer 120 can increase the strength of adhesion between the first metal wiring 130 and the first insulating interlayer 115.

The first metal wiring 130 is formed on the first barrier layer 120. The first metal wiring 130 may be formed using copper, tungsten, aluminum, or gold, silver. The first metal wiring 130 is preferably formed to a thickness of about 1000 to about 3000 Å. In the case in which the first metal wiring layer 130 is form of copper, a damascene process can be employed to form the first metal wiring 130.

A second insulating interlayer 140 is formed on the first metal wiring 130, the first barrier layer 120 and the first insulating interlayer 115. The second insulating interlayer 140 may be formed of a nitride. Preferably, the second insulating interlayer 140 is formed to a thickness of about 100 to about 500 Å.

A third insulating interlayer 150 is formed on the second insulating interlayer 140. Preferably, the third insulating interlayer 150 is formed of an oxide to a thickness of about 1000 to about 3000 Å.

A hole 155 is formed through the third and second insulating interlayers 150 and 140 to expose the first metal wiring 130. However, the hole 155 may expose a portion of the first barrier layer 120. This may occur due to an error in the alignment process for forming the hole 155 (a misalignment between the mask used to form the hole 155 and the structure on which the metal wiring 130 has been formed).

If a second barrier layer were formed directly on the surfaces defining the bottom and sidewall of the hole 155, the exposed portion of the first barrier layer 120 could be corroded. In particular, if such a second barrier layer were formed by a CVD process or an atomic layer deposition (ALD) process using tungsten hexafluoride, the tungsten hexafluoride would decompose into tungsten and fluorine. The fluorine, though, would react with the tantalum or titanium of the exposed portion of the first barrier layer 120. As a result, the exposed portion of the first barrier layer 120 could corrode.

When the first barrier layer 120 comprises tantalum, the chemical equation of the reaction between the first barrier layer 120 and a second barrier layer comprising tungsten can be expressed as follows.

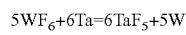

$$5WF_6+6Ta=6TaF_5+5W$$

When the first barrier layer 120 comprises titanium, the chemical equation of the reaction between the first barrier layer 120 and a second barrier layer comprising titanium can be expressed as follows.

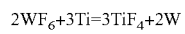

$$2WF_6+3Ti=3TiF_4+2W$$

Forming the first barrier layer 120 so as to comprise a large amount of nitride can increase the corrosion-resistance of the exposed portion of the first barrier layer 12; however, the present inventors find that increasing the amount of the nitride compromises the strength of the adhesive bond between the first barrier layer 120 and the first metal wiring 130 or between the first barrier layer 120 and the first insulating interlayer 115. Thus, simply forming the first barrier layer 120 to have a relatively high percentage of nitride is not a satisfactory solution to the problem of corrosion. Rather, according to example embodiments, the corrosion-resistance of the exposed portion of the first barrier layer 120 is increased by performing following processes without a corresponding decrease in adhesiveness.

Figure 2:
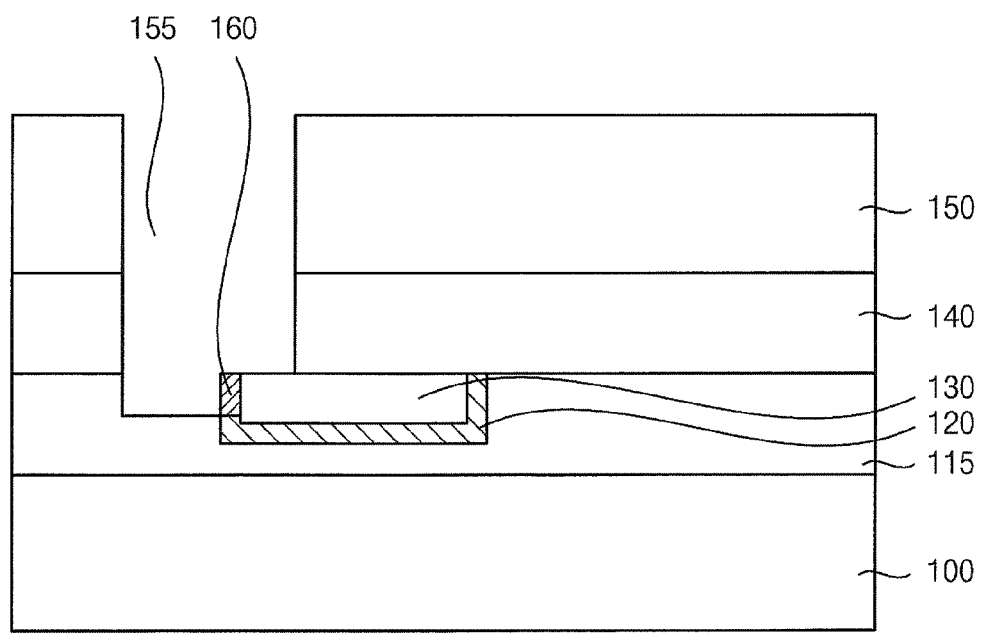

Referring to FIG. 2, a nitridation plasma treatment is performed on the exposed portion of the first barrier layer 120 to produce a metal nitride barrier layer 160. The nitridation plasma treatment may be also performed on the exposed portion of the first metal wiring 130. In the present embodiment, the nitridation plasma treatment is performed using nitrogen gas and hydrogen gas. The ratio of the rates at which the nitrogen gas and hydrogen gas are introduced into the plasma processing chamber in which the treatment takes place is preferably about 10:1. Alternatively, though, the nitridation plasma treatment may be performed using ammonia gas.

In this treatment process, the metal component of a natural metal oxide layer on the first metal wiring 130 is reduced by the hydrogen plasma. Also, the first metal wiring 130 and the exposed portion of the first barrier layer 120 are nitridated by the nitrogen plasma. Thus, even though the first barrier layer 130 is originally formed of a metal nitride, the nitride content of the exposed portion of the first barrier layer 130 is increased.

Figure 5:
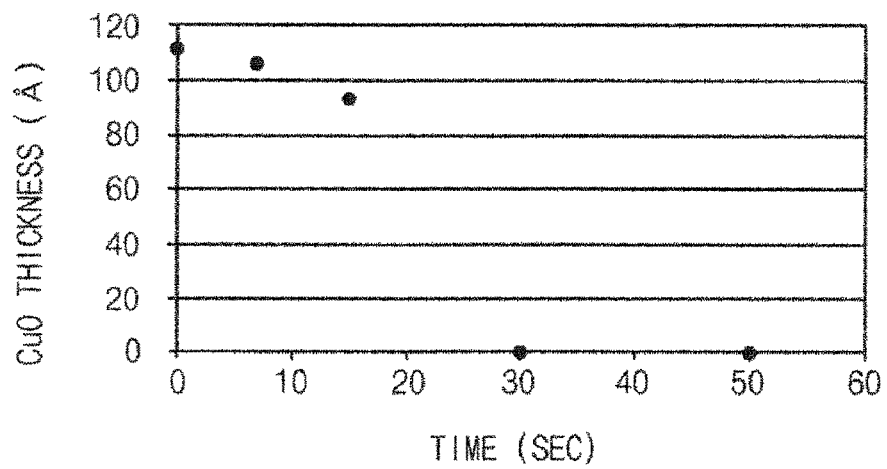
FIG. 5 is a graph illustrating a change in thickness of a natural copper oxide layer on a copper layer during the nitridation plasma treatment.

In the case in which the first metal wiring layer 130 is formed of copper, the nitridation plasma treatment can remove a natural copper oxide layer from the metal wiring layer 130. FIG. 5 is a graph illustrating the change in thickness of a natural copper oxide layer on a copper layer during the nitridation plasma treatment described above. As can be seen from FIG. 5, a natural copper oxide layer can be removed from the metal wiring layer 130 by performing the nitridation plasma treatment for about 30 seconds. The first metal wiring 130 can then be heat-treated to remove the nitrogen component of the nitridated first metal wiring 130.

Figure 6:
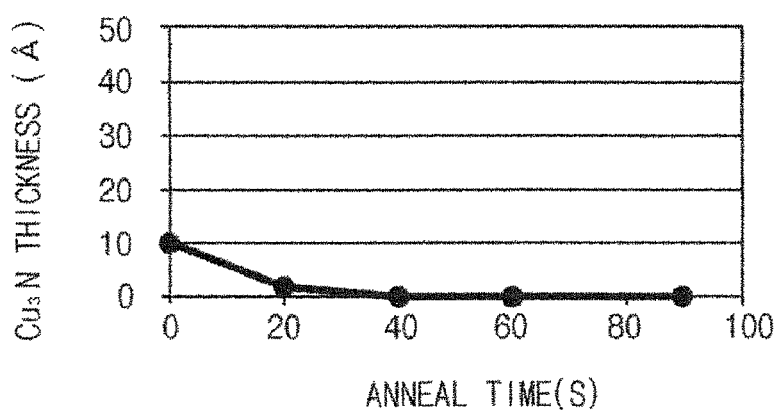
FIG. 6 is a graph illustrating a change in thickness of a copper nitride layer on a copper layer during heat treatment at a temperature of about 300° C.

In this respect, FIG. 6 is a graph illustrating the change in thickness of a copper nitride layer on a copper layer during heat treatment of the copper layer at a temperature of about 300° C. As can be seen from FIG. 6, a copper nitride layer can be removed from a copper layer by performing the heat treatment for about 20 seconds.

Figure 7:
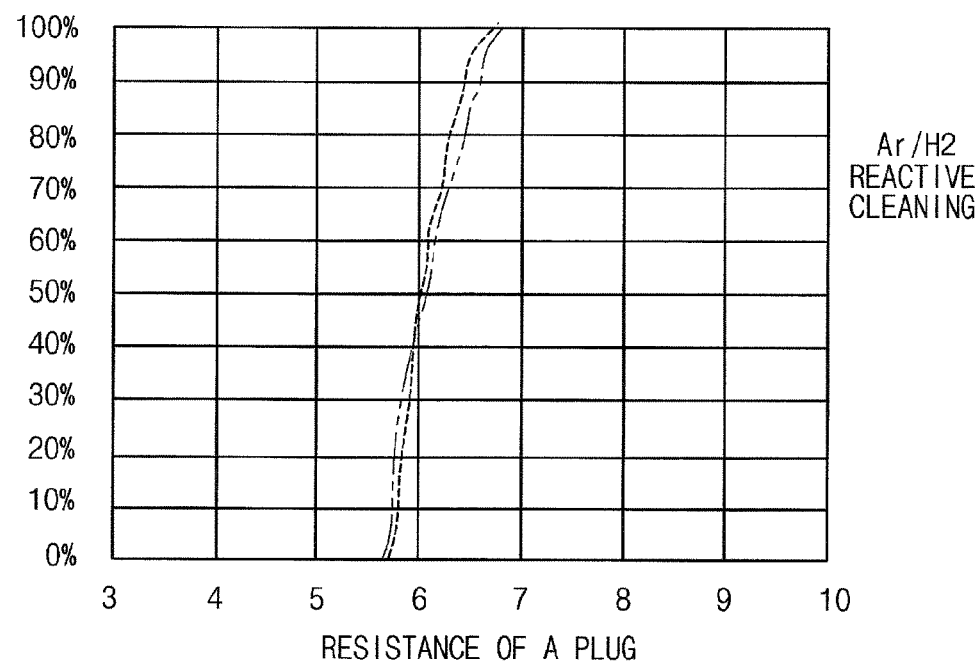
FIG. 7 is a graph illustrating the resistance of a tungsten plug on a copper layer and a tantalum nitride layer when a reactive cleaning process using argon gas and hydrogen gas is performed on the copper layer and the tantalum nitride layer.
Figure 8:
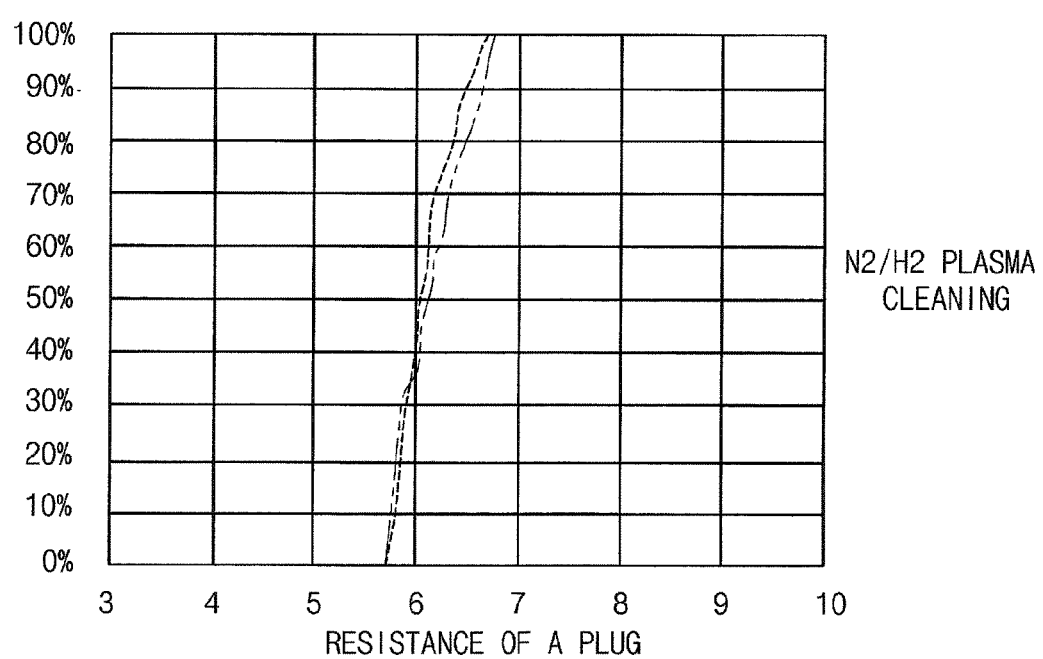
FIG. 8 is a graph illustrating the resistance of a tungsten plug on a copper layer and a tantalum nitride layer when a reactive cleaning process using nitrogen gas and hydrogen gas is performed on the copper layer and the tantalum nitride layer.

FIG. 7 is a graph illustrating the resistance of a tungsten plug on a copper layer and a tantalum nitride layer when a reactive cleaning process using argon gas and hydrogen gas is performed on the copper layer and the tantalum nitride layer, and FIG. 8 is a graph illustrating the resistance of a tungsten plug on a copper layer and a tantalum nitride layer when a plasma cleaning process using nitrogen gas and hydrogen gas is performed on the copper layer and the tantalum nitride layer. The two graphs are substantially the same, i.e., natural copper oxide layers are removed from copper layers to the same degree in each case. Thus, the nitridation plasma treatment is shown to effectively remove the natural metal oxide layer from the first metal wiring 130.

Nonetheless, a reactive cleaning process using argon gas and hydrogen gas may be performed prior to or after the nitridation plasma treatment process to ensure the removal of the natural oxide layer from the metal wiring layer 130.

Figure 3:
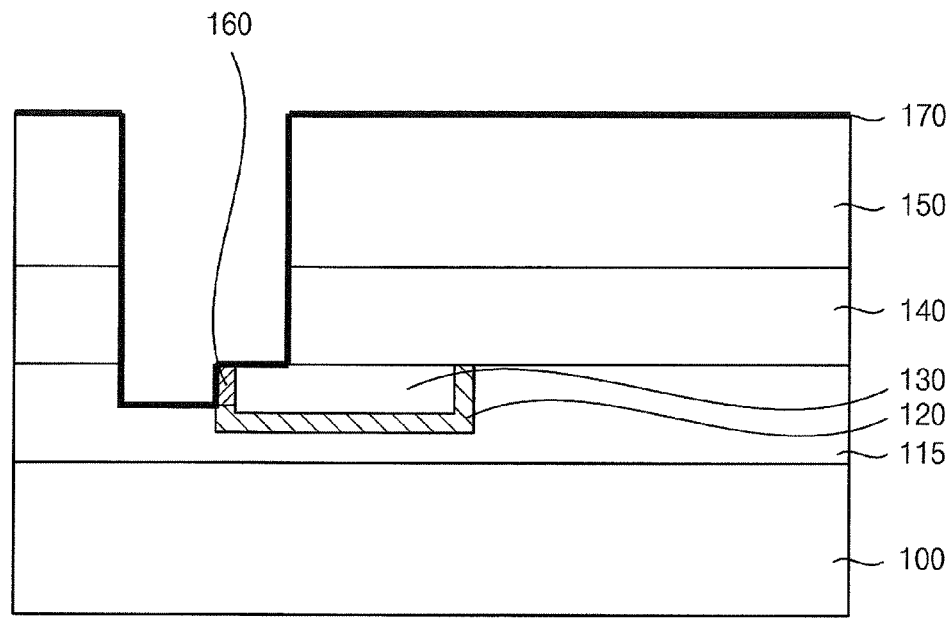

Referring now to FIG. 3, a second barrier layer 170 is formed on the surfaces defining the bottom and the side of the hole 155 and on the upper surface of the third insulating interlayer 150. The second barrier layer 170 may be formed by a CVD process, an ALD process, a sequential flow deposition (SFD) process, or a pulsed nucleation layer (PNL) process using tungsten hexafluoride and ammonia as a source gas. Thus, the second barrier layer 170 comprises tungsten nitride. Preferably, the second barrier layer 170 is formed to a thickness of about 20 to about 300 Å.

As was described above, the exposed portion of the first barrier layer 120 was converted into a metal nitride barrier layer 160 by the nitridation plasma treatment process. Therefore, the exposed portion of the first barrier layer 120 will not react with fluorine decomposed from the tungsten hexafluoride. Thus, the first barrier layer 120 will not be corroded by the second barrier layer 170.

Figure 4:
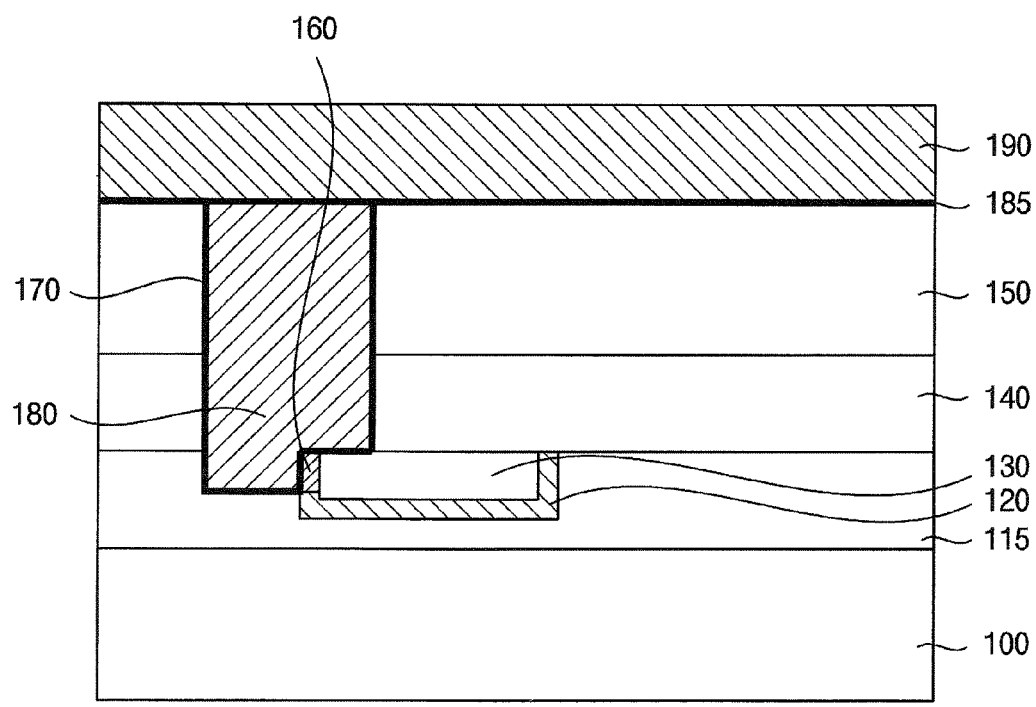

Referring to FIG. 4, a plug 180 is formed on the second barrier layer 170. The plug 180 may be formed by an ALD process, a CVD process, or a PNL process. In the present embodiment, the plug 180 is formed using tungsten hexafluoride and diborane, or tungsten hexafluoride and silane as a source gas. After a nucleation layer is formed using a source gas selected from the group mentioned above, a CVD bulk deposition process may be performed using tungsten hexafluoride and hydrogen to form the tungsten plug. Alternatively, the plug 180 may be formed by a sputtering process.

Next, an upper portion of the plug 180 together with a portion of the second barrier layer 170 on the third insulating interlayer 150 is removed by a chemical mechanical polishing (CMP) process and/or an etch back process.

A third barrier layer 185 is formed on the plug 170 and the third insulating interlayer 150. The third barrier layer 185 may be a metal layer or a metal nitride layer A second metal wiring 190 is formed on the third barrier layer 185. The second metal wiring 190 may be formed of aluminum having a high degree of corrosion resistance. A protection layer (not shown) may be formed on the second metal wiring 190.

Figure 9:
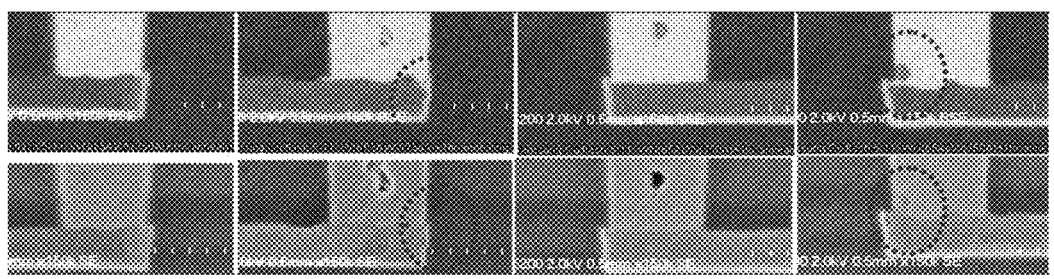
FIG. 9 is an image obtained by scanning electron microscopy (SEM) of a metal wiring structure having copper wiring and a tantalum nitride barrier layer when a reactive cleaning process using argon and hydrogen is performed for about 50 seconds.

FIG. 9 is a scanning electron microscopy (SEM) image of a metal wiring structure including a copper wiring and a tantalum nitride barrier layer wherein the copper wiring was cleaned by a reactive cleaning process using argon and hydrogen for about 50 seconds. As can be seen from FIG. 9, the copper wiring does not have a natural copper oxide layer. However, the tantalum in the tantalum nitride layer is corroded to a depth of about 82 Å.

Figure 10:
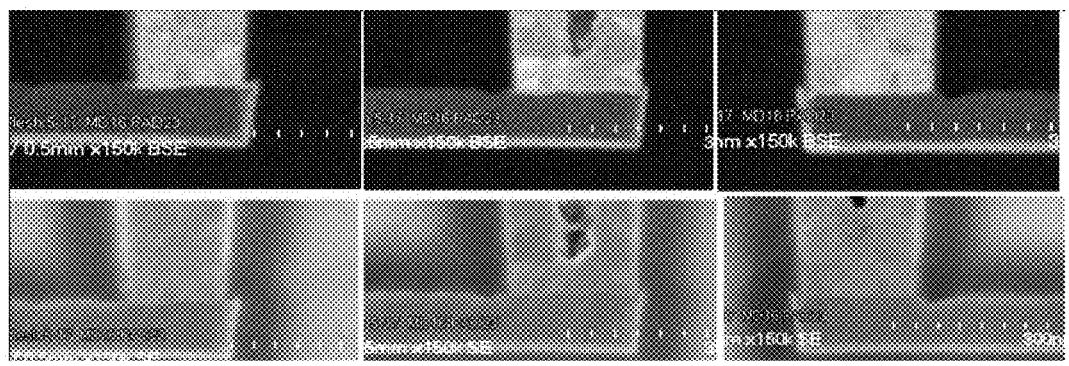
FIG. 10 is a SEM image of a metal wiring structure having a copper wiring and a tantalum nitride barrier layer when each of a reactive cleaning process using argon and hydrogen and a nitridation plasma treatment is performed for about 30 seconds.

FIG. 10 is a SEM image of a metal wiring structure having a copper wiring and a tantalum nitride barrier layer wherein both a reactive cleaning process using argon and hydrogen and a nitridation plasma treatment is performed for about 30 seconds. As can be seen from FIG. 10, the copper wiring does not have a natural copper oxide layer, and the tantalum in the tantalum nitride layer is corroded only to a depth of about 3 Å (thickness).

A method of manufacturing another type of metal wiring structure accordance with example embodiments will now be described with reference to FIGS. 11 to 16.

Figure 11:
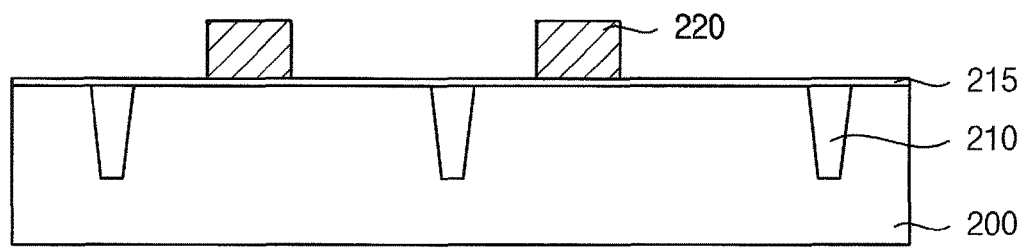
FIGS. 11 to 16 are cross-sectional views of a substrate and together illustrate another embodiment of a method of manufacturing a metal wiring structure.

Referring first to FIG. 11, an isolation layer 210 is formed on a semiconductor substrate 200. A gate insulation layer 215 is formed on the semiconductor substrate 200 and the isolation layer 210. A gate electrode 220 is formed on the gate insulation layer 215. A gate spacer (not shown) may be formed on a sidewall of the gate electrode 220. Additionally, a source/drain region (not shown) is formed at an upper portion of the semiconductor substrate 200 adjacent to the gate electrode 220.

Figure 12:
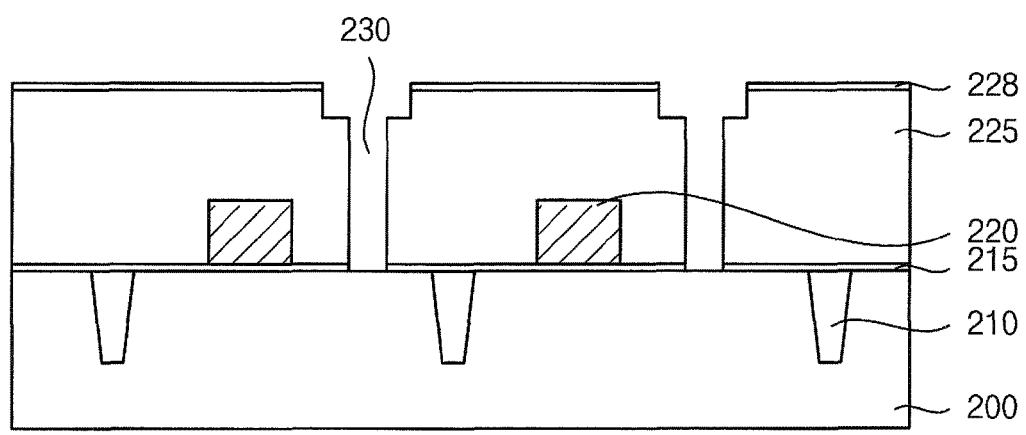

Referring to FIG. 12, a first insulating interlayer 225 is formed on the gate electrode 220 and the gate insulation layer 215. The first insulating interlayer 225 may be formed of a low-k material by a CVD process. The first insulating interlayer 225 is planarized by a CMP process and/or an etch back process. Then, a first etch stop layer 228 is formed on the first insulating interlayer 225. Next, a first opening 230 is formed through the first insulating interlayer 225 to expose part of the semiconductor substrate 200.

Figure 13:
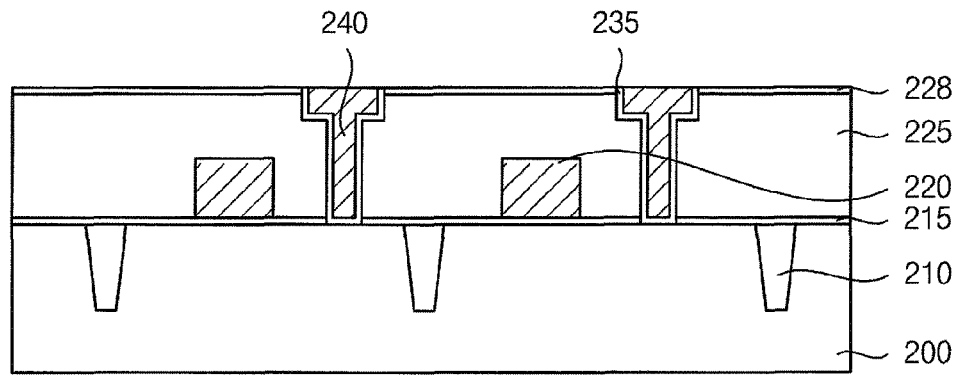

Referring to FIG. 13, a first barrier layer 235 is formed on surfaces that define the bottom and the sides of the first opening 230. A first metal wiring 240 is then formed on the first barrier layer 235 to such a thickness as to fill the first opening 230. Additional etch stop layers (not shown) may be formed; however, the etch stop layers are not shown here for the purpose of brevity and to keep the figures clear.

Figure 14:
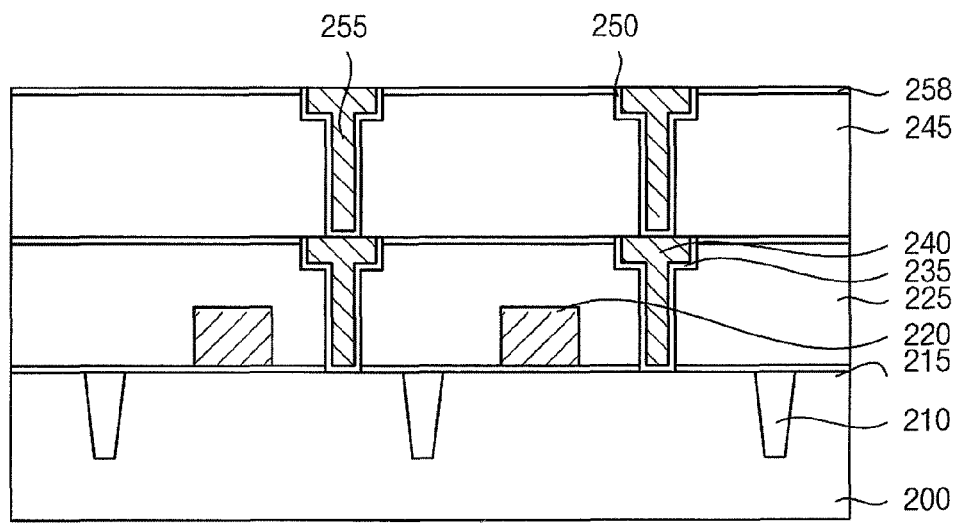

Referring to FIG. 14, a second insulating interlayer 245 is formed on the first insulating interlayer 225, the first metal wiring 240 and the first barrier layer 235. The second insulating interlayer 245 may be formed of a low-k material by a CVD process. The second insulating interlayer 245 is then planarized by a CMP process and/or an etch back process. A second etch stop layer 258 is then formed on the second insulating interlayer 245. A second opening is formed through the second insulating interlayer 245 to expose the first metal wiring 240, and a second barrier layer 250 is formed on surfaces of the second insulating layer 245 that define the bottom and sides of the second opening. The second barrier layer 250 may be formed by a sputtering process using tantalum, titanium, tantalum nitride, or titanium nitride. Preferably, the second barrier layer 250 is formed to a thickness of about 100 to about 300 Å.

A second metal wiring 255 is then formed to fill the second opening. The second metal wiring 255 may be formed of copper, tungsten, aluminum, gold, or silver.

Figure 15:
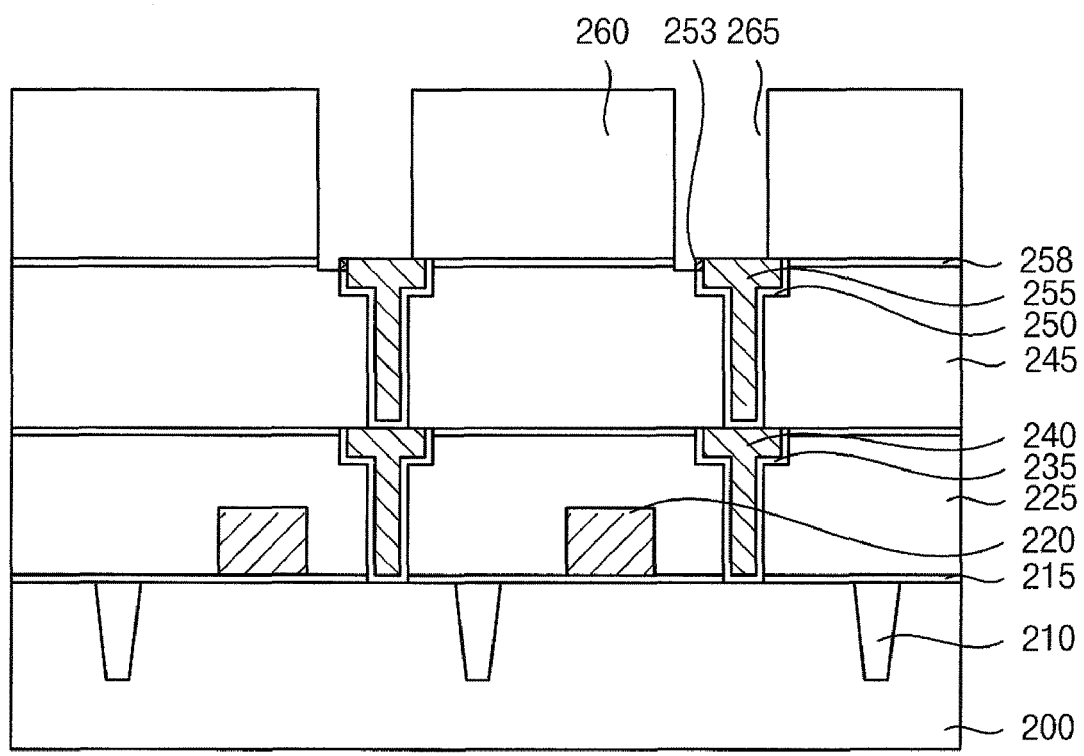

Referring to FIG. 15, a third insulating interlayer 260 is formed on the second etch stop layer 258, the second metal wiring 255 and the second barrier layer 250. The third insulating interlayer 260 is preferably an oxide formed to a thickness of about 1000 to about 3000 Å.

A hole 265 is formed through the third insulating interlayers 260 to expose the second metal wiring 255. The hole 265 may expose a portion of the second barrier layer 250, especially when a misalignment error occurs. Even in the absence of a misalignment error, the hole 265 may expose part of the second barrier layer 250.

A nitridation plasma treatment is then performed on the exposed portion of the second barrier layer 250 to thereby produce a metal nitride barrier layer 253. The nitridation plasma treatment may be also performed on the exposed second metal wiring 255. In one example embodiment, the nitridation plasma treatment is performed using ammonia gas. In the present embodiment, though, the nitridation plasma treatment is performed using nitrogen gas and hydrogen gas. The metal component of a natural metal oxide layer on the second metal wiring 255 is reduced by the hydrogen plasma. Also, the second metal wiring 255 and the exposed portion of the second barrier layer 250 are nitridated by the nitrogen plasma. Thus, the nitride content of the exposed portion of the second barrier layer 250 is increased.

Figure 16:
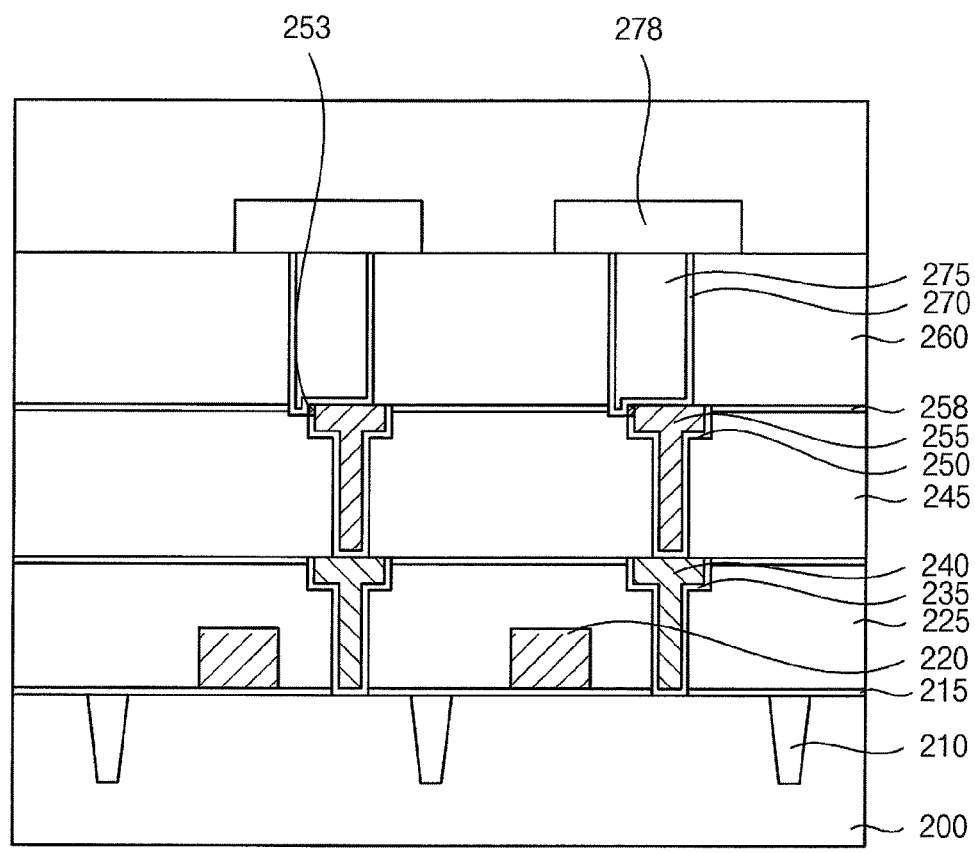

Referring to FIG. 16, a third barrier layer 270 is formed on the surfaces that define the bottom and sides of the hole 265. The third barrier layer 270 may comprise tungsten nitride and can be formed by a CVD process, an ALD process, a SFD process, or a PNL process using tungsten hexafluoride and ammonia as a source gas. Preferably, the third barrier layer 270 is formed to a thickness of about 20 to about 300 Å.

Next, a plug 275 is formed to fill the hole 265. The plug 275 may be formed by an ALD process, a CVD process, or a PNL process using tungsten hexafluoride and diborane, or tungsten hexafluoride and silane as a source gas. In particular, first, a nucleation layer is formed using the above-mentioned source gas. Then, a CVD bulk deposition process is performed using tungsten hexafluoride and hydrogen to form a tungsten plug. Alternatively, the plug 275 may be formed by a sputtering process.

A third metal wiring 278 is formed on the third insulating interlayer 260 as electrically connected to the plug 275. The third metal wiring 278 may be formed of aluminum so as to be highly corrosion-resistant. A protection layer (not shown) may be additionally formed on the third metal wiring 278.

A method of manufacturing a semiconductor device having a metal wiring structure, in accordance with example embodiment, will be described with reference to FIGS. 17 to 35.

Figure 17:
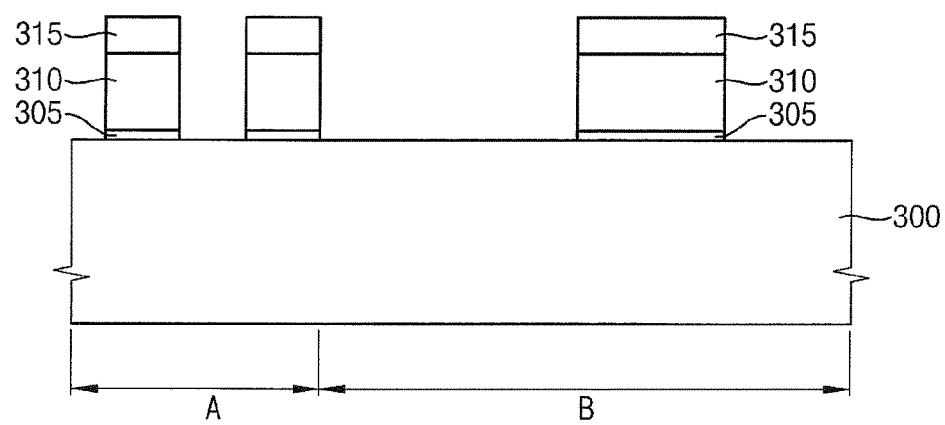
FIGS. 17 to 35 are cross-sectional views of a substrate and together illustrate a method of manufacturing a semiconductor device including a metal wiring structure.

Referring to FIG. 17, a gate structure including a tunnel insulation layer 305, a floating gate 310 and a first hard mask 315 is formed on a substrate 300. Note, impurities may be implanted into the substrate 300 to form wells before the gate structure is formed.

The substrate 300 may be a silicon wafer or a silicon-on-insulator (SOI) substrate. Also, the substrate 300 has a cell region A and a peripheral region B, and a metal wiring structure including a metal wiring and a plug is formed in the peripheral region B, as will be described in more detail later on.

The tunnel insulation layer 305 may be formed by a thermal oxidation process to a thickness of about 50 to about 100 Å. In the present embodiment, the tunnel insulation layer 305 is formed by a radical oxidation process.

The floating gate 310 may be formed by a CVD process. Preferably, the floating gate 310 is formed to a thickness of about 500 to about 1500 Å.

The first hard mask 315 may have a lower layer including an oxide or a nitride, an organic layer on the lower layer, and an anti-reflection layer including a nitride on the organic layer.

Figure 18:
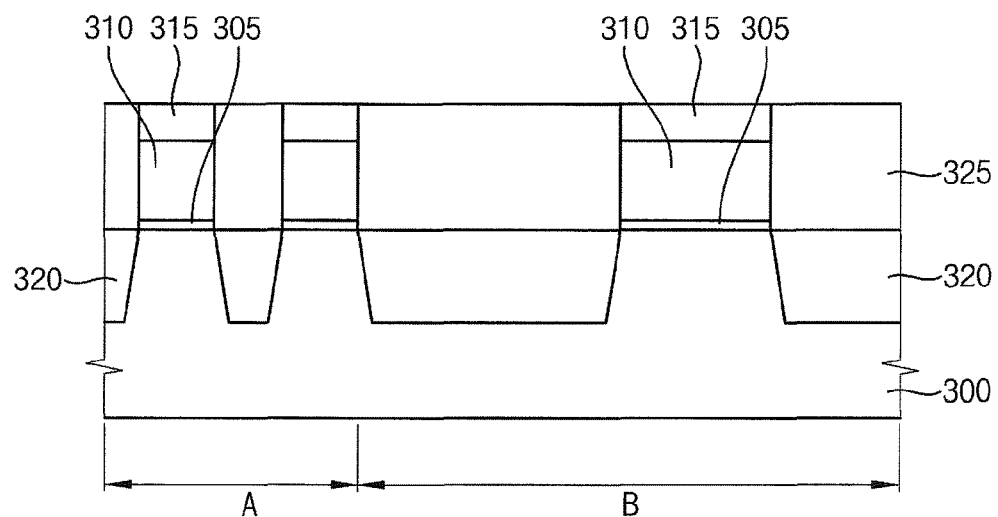

Referring to FIG. 18, a trench (not shown) is formed in the substrate 300 using the gate structure as a mask. The trench is preferably formed to a depth of about 2000 to about 4000 Å. Note, Insulating material is then deposited to fill the trench and thereby form an isolation layer 320. In this respect, the sides of the trench may be formed so as to subtend an acute angle with the plane of the upper surface of the substrate 300. Thus, the insulating material can easily fill the trench completely. Impurities may be implanted into the substrate 300 adjacent to the trench before forming the isolation layer 320.

In one example, spin-on-glass (SOG) is formed using polysilazane to thereby fill the trench and thereby form the isolation layer 320. In another example, undoped silicon glass (USG) is formed in the trench using a CVD process to fill the trench and thereby form the isolation layer 320. Then, an etch back process may be performed to planarize the isolation layer 320.

Next, a high density plasma-chemical vapor deposition (HDP-CVD) process may be performed to deposit insulating material on the isolation layer 320 between the gate structure and thereby form an insulation layer 325. The insulation layer 325 may then be planarized by a CMP process.

Figure 19:
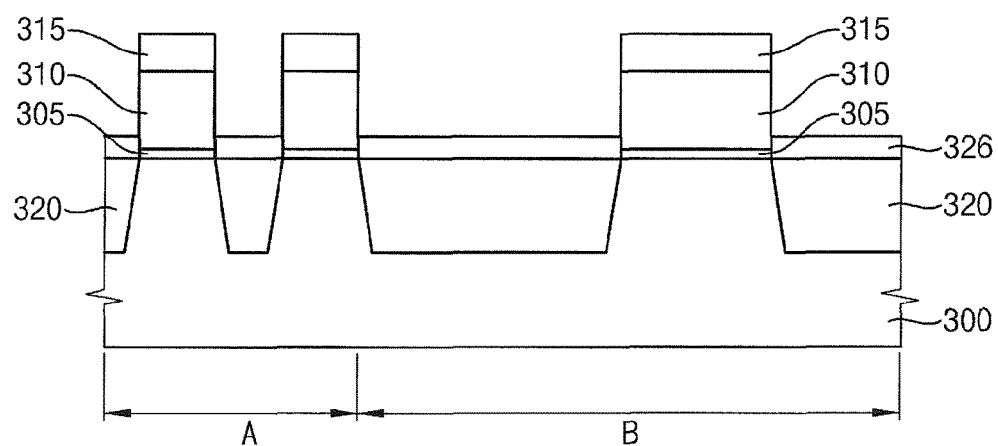

Referring to FIG. 19, an etch back process is performed to remove an upper portion of the insulation layer 325. As a result an insulation layer pattern 326 is formed.

Figure 20:
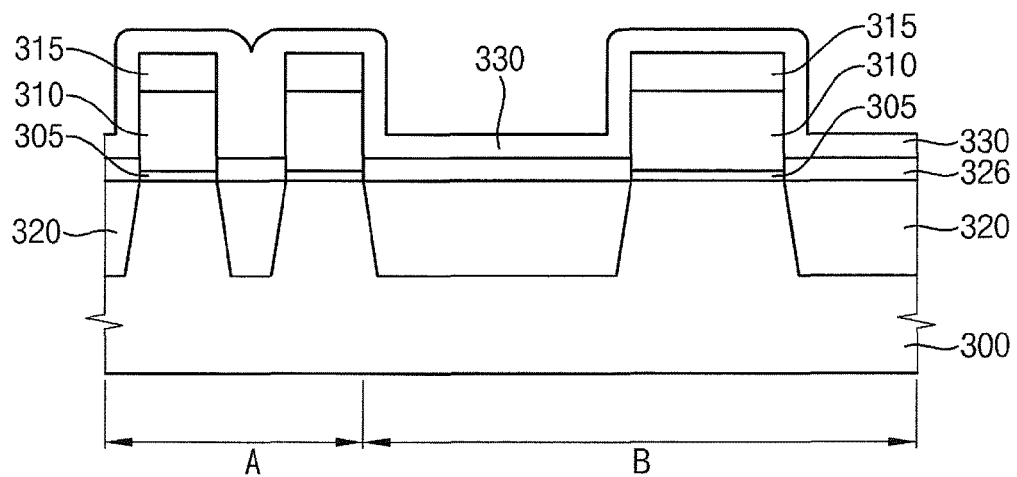

Referring to FIG. 20, a spacer layer 330 is formed on the gate structure, the first insulation layer pattern 326. The spacer layer 330 may be formed by a CVD process. In the present embodiment, the spacer layer 330 is formed to a thickness that is greater than half the distance between adjacent ones of the gate structures in the cell region A. Also, the spacer layer 330 is formed of a material having an etch selectivity with respect to the isolation layer 320. In the present embodiment, the spacer layer 330 is a middle temperature oxide (MTO) layer.

Figure 21:
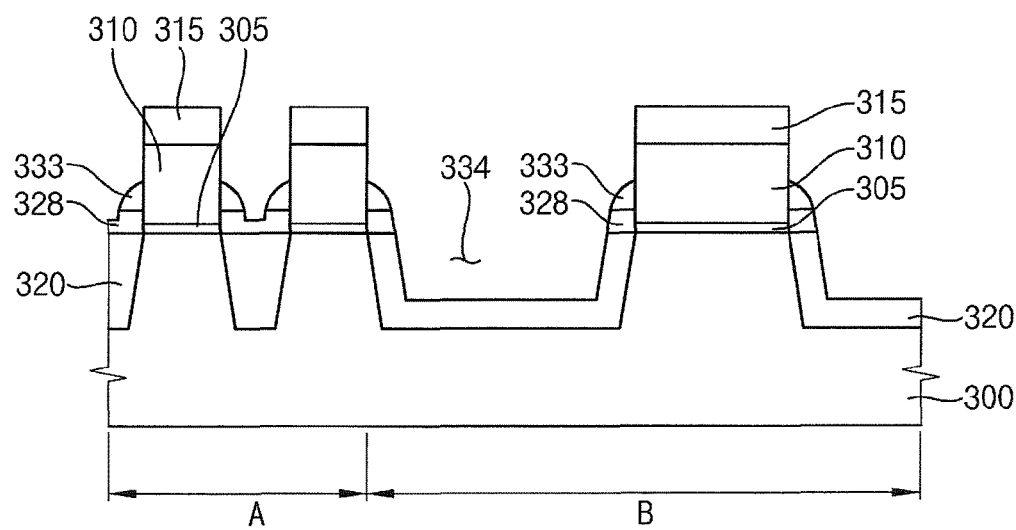

Referring to FIG. 21, part of the spacer layer 330 is removed by an anisotropic etching process to form first spacers 333 on sidewalls of the gate structure. The first spacers 333 increase the coupling ratio of a semiconductor device including the gate structure. In the peripheral region B, part of the insulation layer pattern 326 is removed to form second spacers 328. Additionally, in the peripheral region B, a portion of the isolation layer is removed to form a recess 334.

Figure 22:
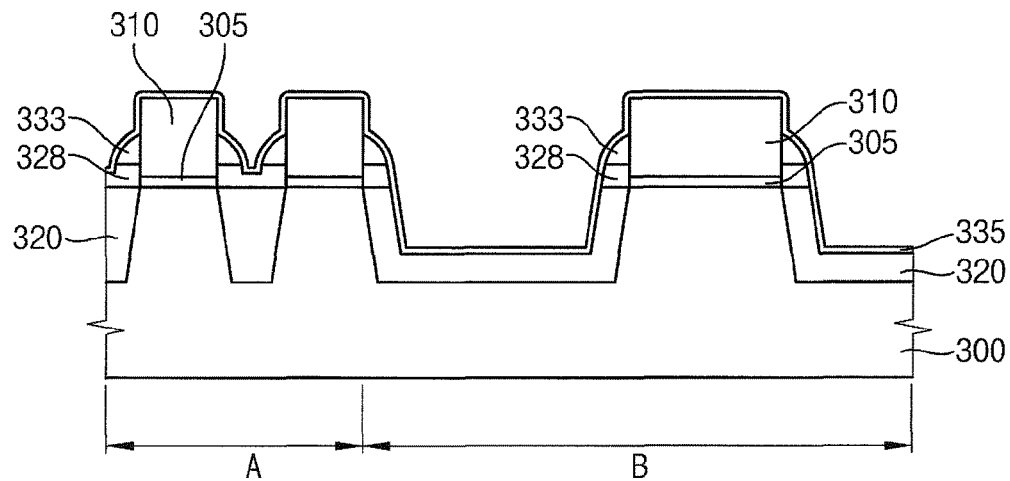

Referring to FIG. 22, the first hard mask 315 is removed. Then, a dielectric layer 335 is formed on the floating gate 310, the first and second spacers 333 and 328, and the isolation layer 320. The dielectric layer 335 is formed of a material having a capacitance higher than that of the tunnel insulation layer 305, such as oxide-nitride-oxide (ONO), aluminum oxide, or hafnium oxide. Preferably, the dielectric layer 335 is formed to a thickness of about 100 to about 200 Å.

Figure 23:
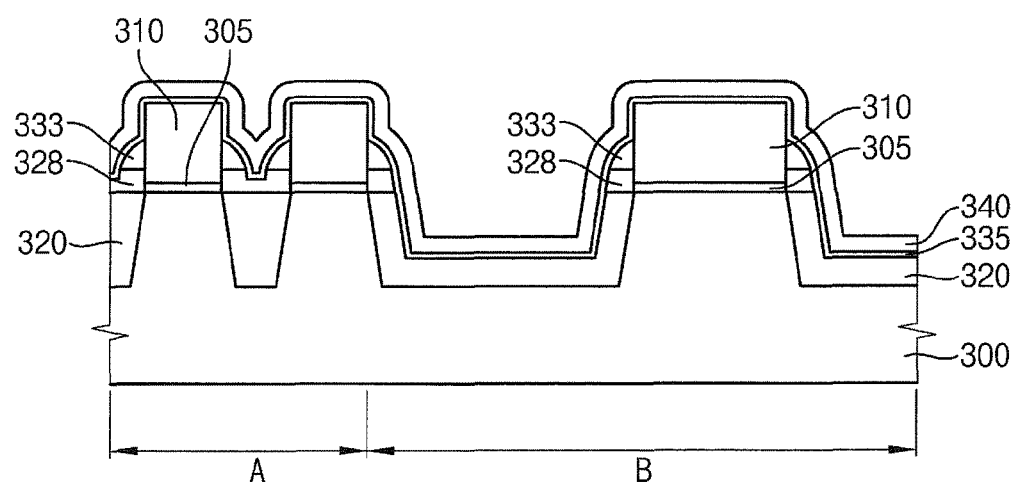

Referring to FIG. 23, a first control gate layer 340 of, for example, doped polysilicon is formed on the dielectric layer 335. The first control gate layer 340 may be formed by a CVD process to a thickness of about 500 to about 1000 Å.

Figure 24:
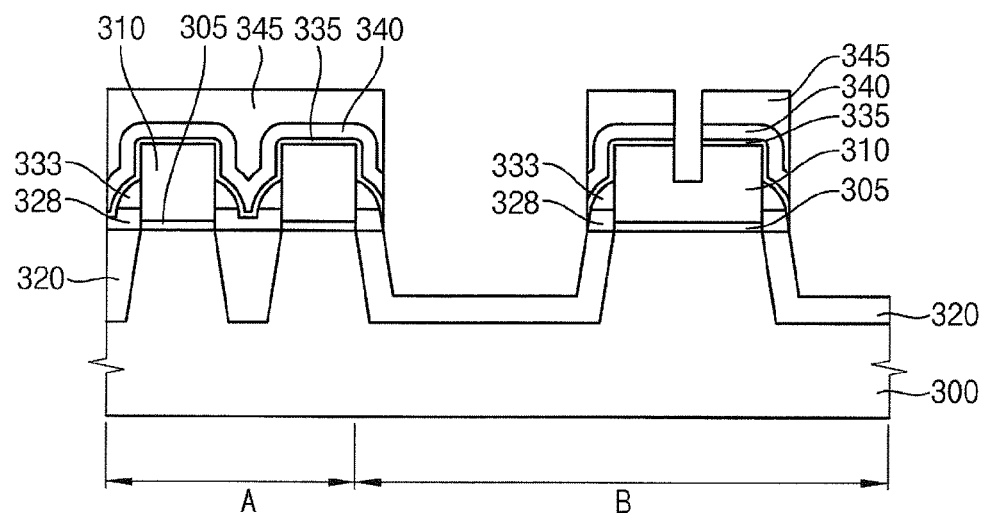

Referring to FIG. 24, a portion of the first control gate layer 340 and a portion of the dielectric layer 335 that are in the peripheral region B are removed using an etching process employing a mask 345. More specifically, portions of the first control gate layer 340 and the dielectric layer 335 on the isolation layer 320 in the peripheral region B, and a portion of the first control gate layer 340 and the dielectric layer 335 on the floating gate 310 in the peripheral region B are removed. A portion of the floating gate 310 in the peripheral region B may be also removed.

Figure 25:
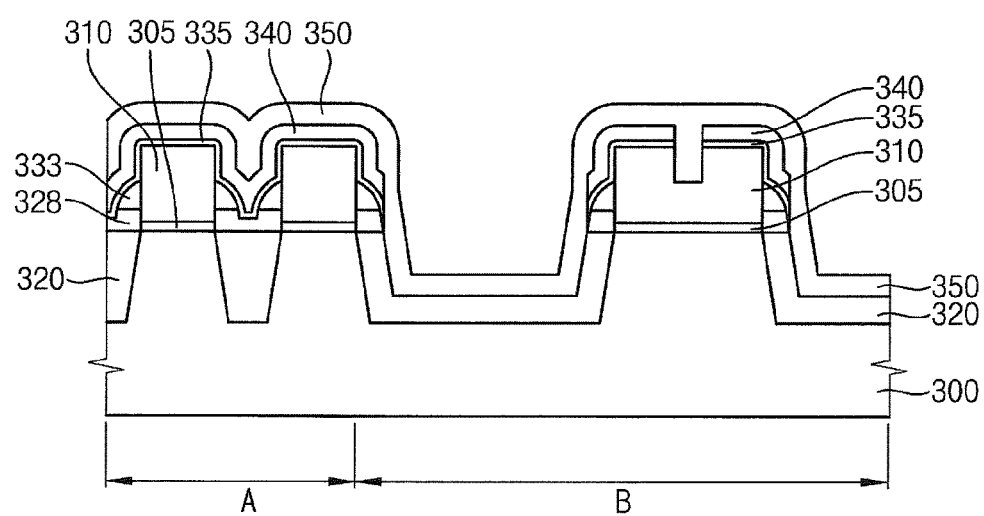

Referring to FIG. 25, the mask 345 is removed. Then, a second control gate layer 350 of, for example, doped polysilicon is formed on the first control gate layer 340, the isolation layer 320 and the floating gate 310. The second control gate layer 350 may be formed by a CVD process to a thickness of about 500 to about 1000 Å.

Figure 26:
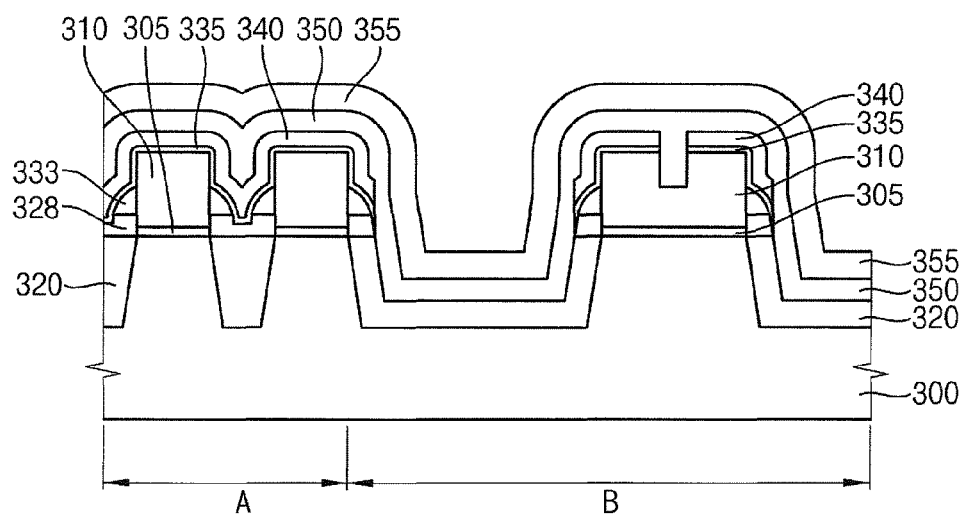

Referring to FIG. 26, a control gate metal layer 355 is formed by a CVD process. The control gate metal layer 355 may be formed of tungsten silicide to a thickness of about 500 to about 1000 Å. An additional heat treatment may be performed to improve bonding between the first and second control gate layers 340 and 350 and the control gate metal layer 355. As an example, the heat treatment is performed in a nitrogen gas atmosphere at a temperature less than about 850° C.

Figure 27:
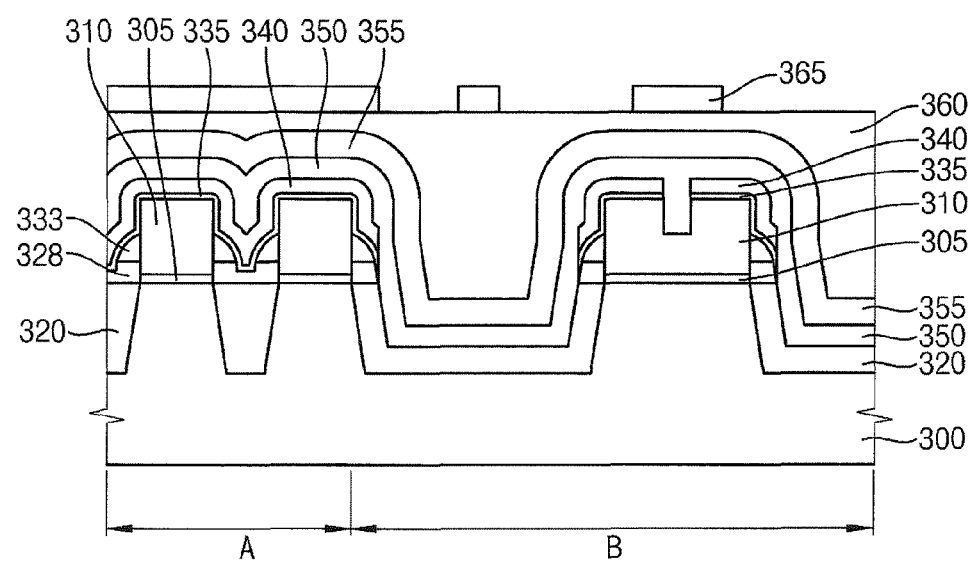

Referring to FIG. 27, a second hard mask 360 is formed on the control gate metal layer 355. The second hard mask 360 may be a stack of layers of several different materials. For example, the second hard mask 360 may include a plasma CVD oxide layer formed on the control gate metal layer 355 to a thickness of about 2000 to about 3000 Å, an amorphous carbon layer formed on the plasma CVD oxide layer to a thickness of about 2000 to about 3000 Å, and an anti-reflective layer (ARL) formed on the amorphous carbon layer to a thickness of about 500 Å using a nitride. A third hard mask 365 is formed on the second hard mask 360.

Figure 28:
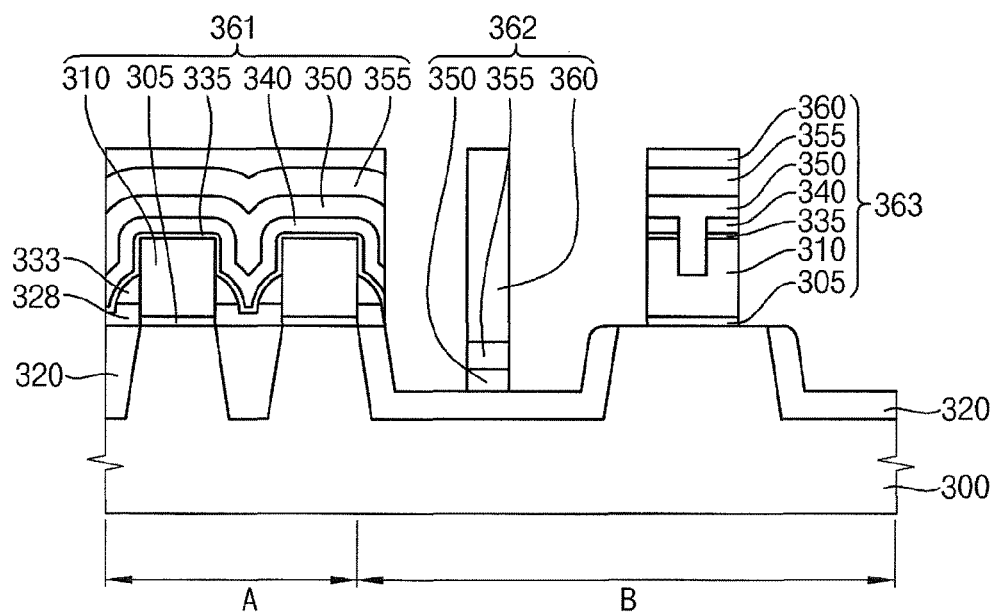

Referring to FIG. 28, the second hard mask 360 is etched using the third hard mask 365 as an etch mask. The control gate metal layer 355, the second and first control gate layers 350 and 340, the dielectric layer 335, the floating gate 310, and the tunnel insulation layer 305 are etched using the third and second hard masks 365 and 360 together as an etch mask. Then, the third hard mask 365 is removed. Thus, a cell transistor is formed in the cell region A, and a shield plate 362 and a high voltage transistor 363 are formed in the peripheral region B. The shield plate 362 is made up remaining of portions of the second hard mask 360, the gate control metal layer 355, and the second control gate layer 350.

Figure 29:
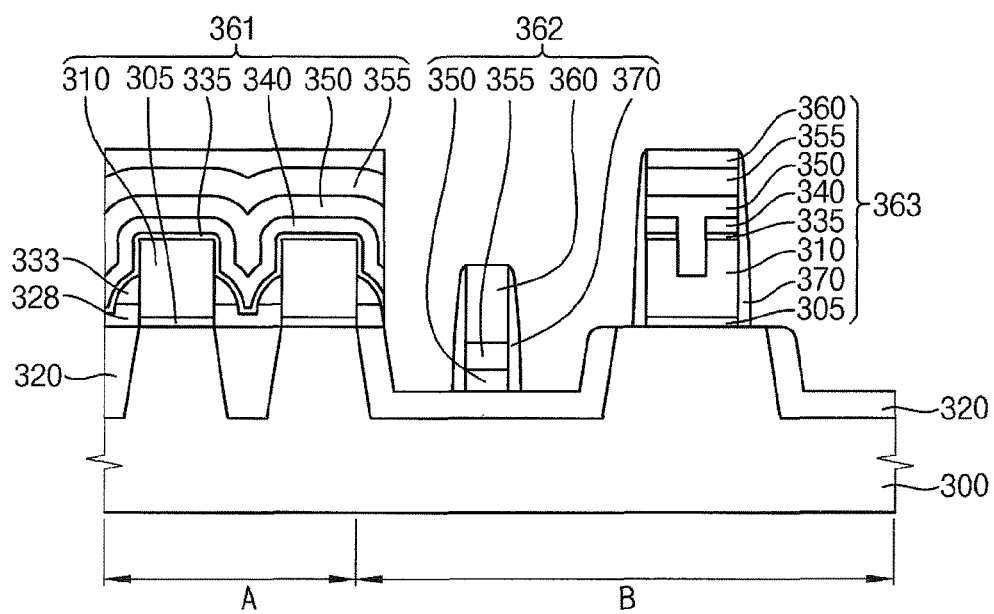

Referring to FIG. 29, the ARL and the amorphous carbon layer of the second hard mask 360 are removed to reduce the height of the shield plate 362. Then, third spacers 370 are formed on sidewalls of the cell and high voltage transistors 361 and 363 and the shield plate 362. In the present embodiment, the third spacers are 370 formed of an MTO to a thickness less than about 1000 Å. Also, a source/drain region (not shown) is formed at an upper portion of the substrate 300 adjacent to the cell and high voltage transistors 361 and 363.

Figure 30:
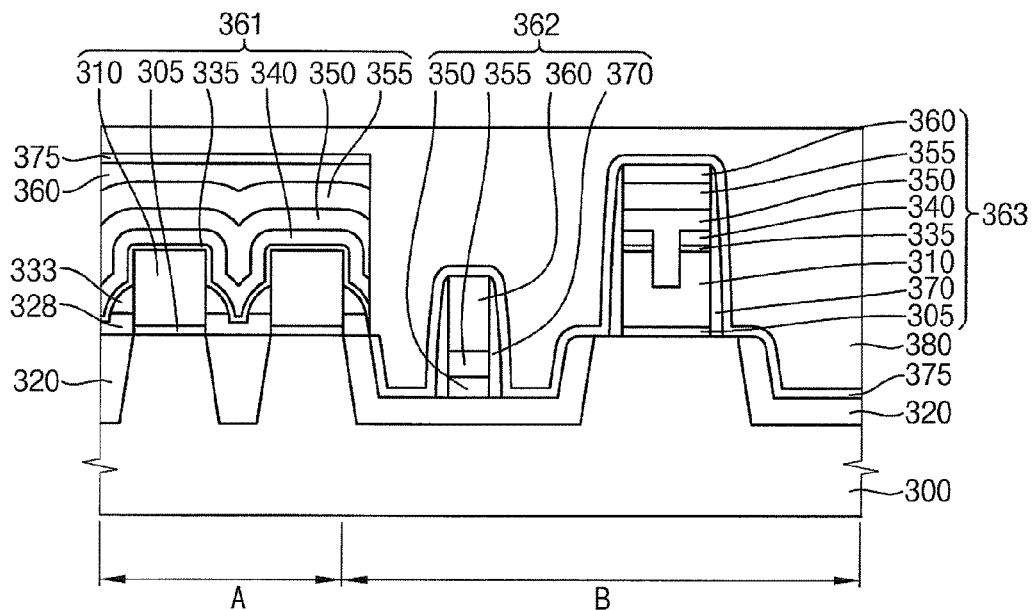

Referring to FIG. 30, an etch stop layer 375 is formed a nitride on the cell and high voltage transistors 361 and 363, the shield plate 362, and the isolation layer 320. As an example, the etch stop layer 375 is a nitride layer formed by a CVD process to a thickness of about 200 to about 500 Å.

A first insulating interlayer 380 is formed on the etch stop layer 375. The first insulating interlayer 380 may be formed by an HDP-CVD process. For example, a first HDP-CVD process may be performed to form a first layer (not shown) having a thickness of about 2000 Å, a wet etching process may be performed on the resulting structure, a second HDP-CVD process may be performed to form a second layer (not shown) having a thickness more than about 6000 Å, and a CMP process may be performed to planarize the second layer.

Figure 31:
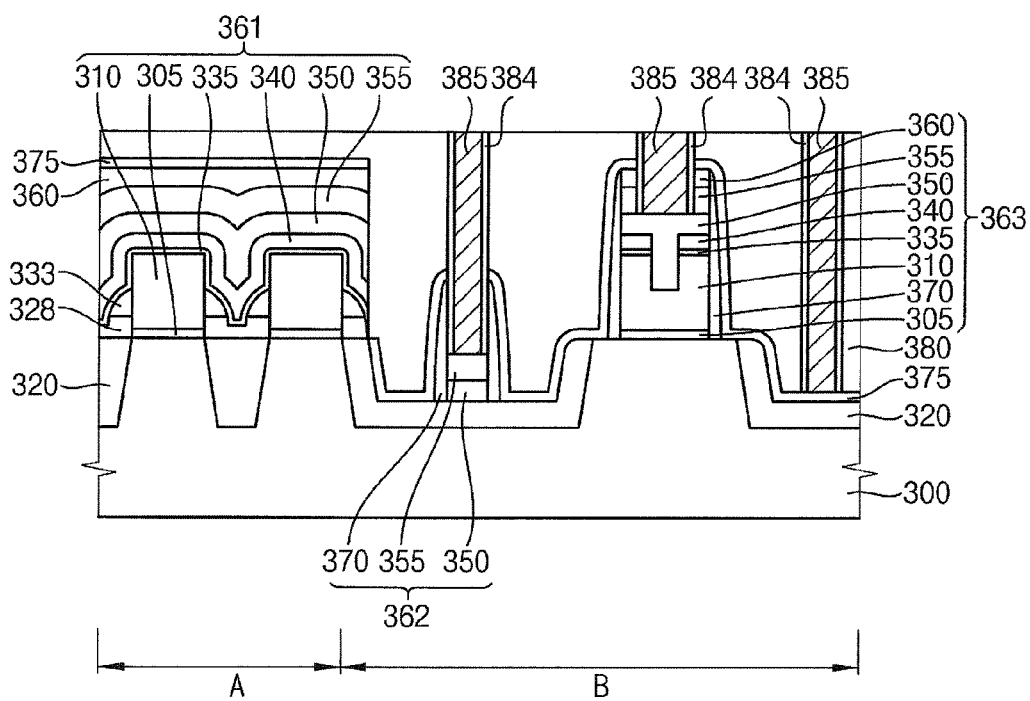

Referring to FIG. 31, a first contact hole (not shown) is formed through the first insulating interlayer 380, the etch stop layer 375, the second hard mask 360, the control gate metal layer 355 in the peripheral region B. Next, a first barrier layer 384 is formed by a sputtering process to a thickness of about 100 Å on a sidewall of the first insulating layer 380 that defines the sides of the first contact hole. The first barrier layer 384 is formed of titanium, titanium tungsten, or titanium nitride. A first plug 385 of tungsten is then formed to fill the remaining portion of the first contact hole.

Figure 32:
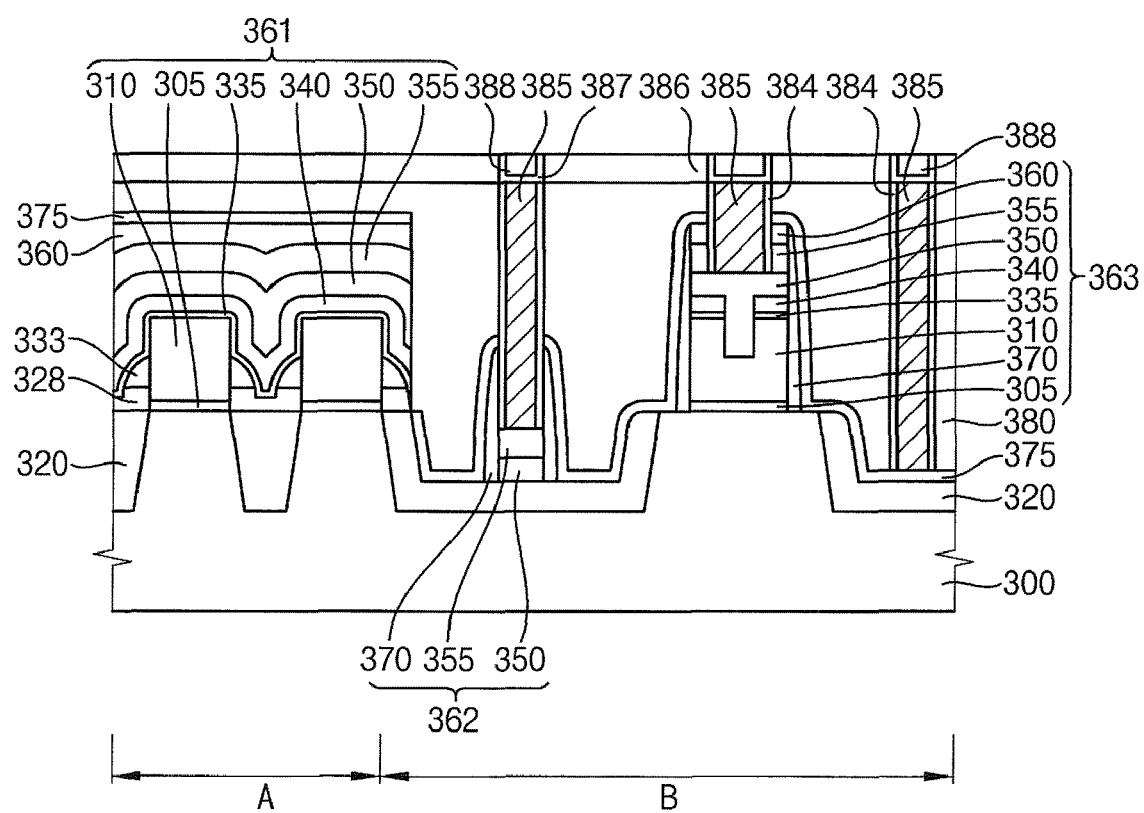

Referring to FIG. 32, a second insulating interlayer 386 is formed on the first insulating interlayer 380 and the first plug 385. The second insulating interlayer 386 may be formed of a low-k material by a CVD process. An opening (not shown) is formed through the second insulating interlayer 386 to expose the first plug 385.

A second barrier layer 387 is formed on the surfaces that define the bottom and sides of the opening. For example, the second barrier layer 387 is formed of tantalum, titanium, tantalum nitride, or titanium nitride using a sputtering process. In the present embodiment, the second barrier layer 387 is formed to a thickness of about 100 to about 300 Å. A first metal wiring 388 is then formed on the second barrier layer 387 to fill the opening. The first metal wiring 388 may be formed of copper, tungsten, aluminum, gold, or silver. Preferably, the first metal wiring 388 may be formed to a thickness of about 1000 to about 3000 Å. When the first metal wiring 388 is of copper, a damascene process may be used to form the first metal wiring 388. In the present embodiment, the first metal wiring 388 is a bit line.

Figure 33:
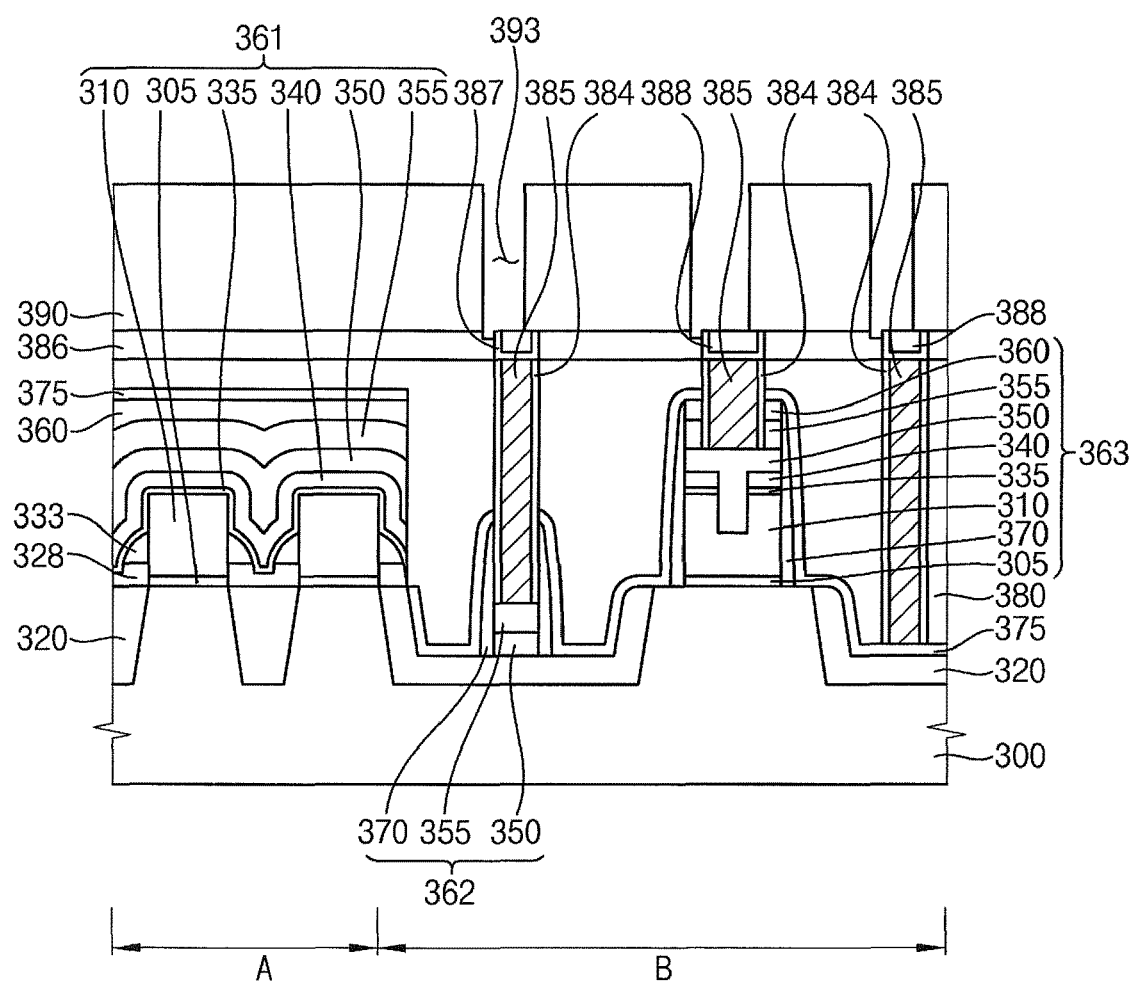

Referring to FIG. 33, a third insulating interlayer 390 is formed on the second insulating interlayer 386, the first metal wiring 388 and the second barrier layer 387. The third insulating interlayer 390 may be formed of a low-k material using a CVD process. Preferably, the third insulating interlayer 390 is formed to a thickness of about 3000 to about 5000 Å.

A second contact hole 393 is formed through the third insulating interlayer 390 to expose the first metal wiring 388. The contact hole 393 may expose a portion of the second barrier layer 387, such as might occur due to a misalignment error in the process of forming the contact hole 393. Even if a misalignment error does not occur, the contact hole 393 may still expose a portion of the second barrier layer 387.

Figure 34:
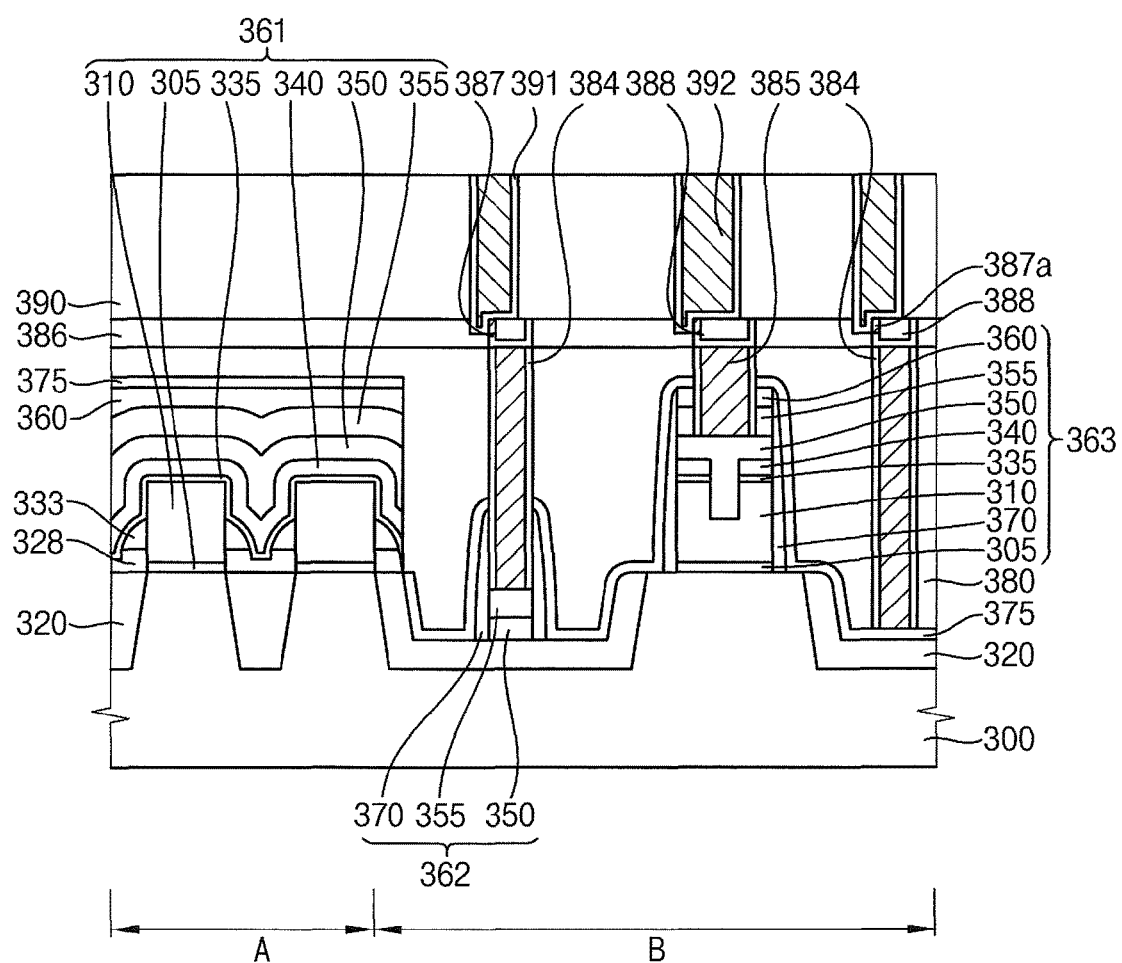

Referring to FIG. 34, a nitridation plasma treatment is performed on the exposed portion of the second barrier layer 387. As a result, a metal nitride barrier layer 387a is formed. The nitridation plasma treatment may also be performed on the exposed first metal wiring 388. In the present embodiment, the nitridation plasma treatment is performed by creating a hydrogen plasma using nitrogen gas and hydrogen gas, and exposing the second barrier layer 387 (and the first metal wiring 388) to the hydrogen plasma. Alternatively, though, the nitridation plasma treatment may be performed by creating a hydrogen plasma using ammonia gas, exposing the second barrier layer 387 (and the first metal wiring 388) to the hydrogen plasma.

In any case, a metal component of a natural metal oxide layer on the first metal wiring 388 is reduced by the hydrogen plasma. Also, the first metal wiring 388 and the exposed portion of the second barrier layer 387 are nitridated by the nitrogen plasma. Thus, even though the second barrier metal layer 387 (a metal nitride) has a nitride component, the nitride content of the exposed portion of the second barrier layer 387 is increased.

A third barrier layer 391 is formed on the surfaces that define the bottom and sides of the second contact hole 393. The third barrier layer 391 is formed of tungsten nitride. The tungsten nitride barrier layer 391 may be formed by a CVD process, an ALD process, a SFD process, or a PNL process using tungsten hexafluoride and ammonia as a source gas. In the present embodiment, the third barrier layer 391 is formed to a thickness of about 20 to about 300 Å.

A second plug 392 of tungsten is formed on the third barrier layer 391 to fill the second contact hole 393. The second plug 392 may be formed by an ALD process, a CVD process, or a PNL process. For example, the second plug 392 may be formed using tungsten hexafluoride and diborane, or tungsten hexafluoride and silane as a source gas in one of the above-mentioned processes. For example, the source gas is used to form a nucleation layer, and then a CVD bulk deposition process is performed using tungsten hexafluoride and hydrogen to form the second plug 392. Alternatively, the second plug 392 may be formed by a sputtering process.

Figure 35:
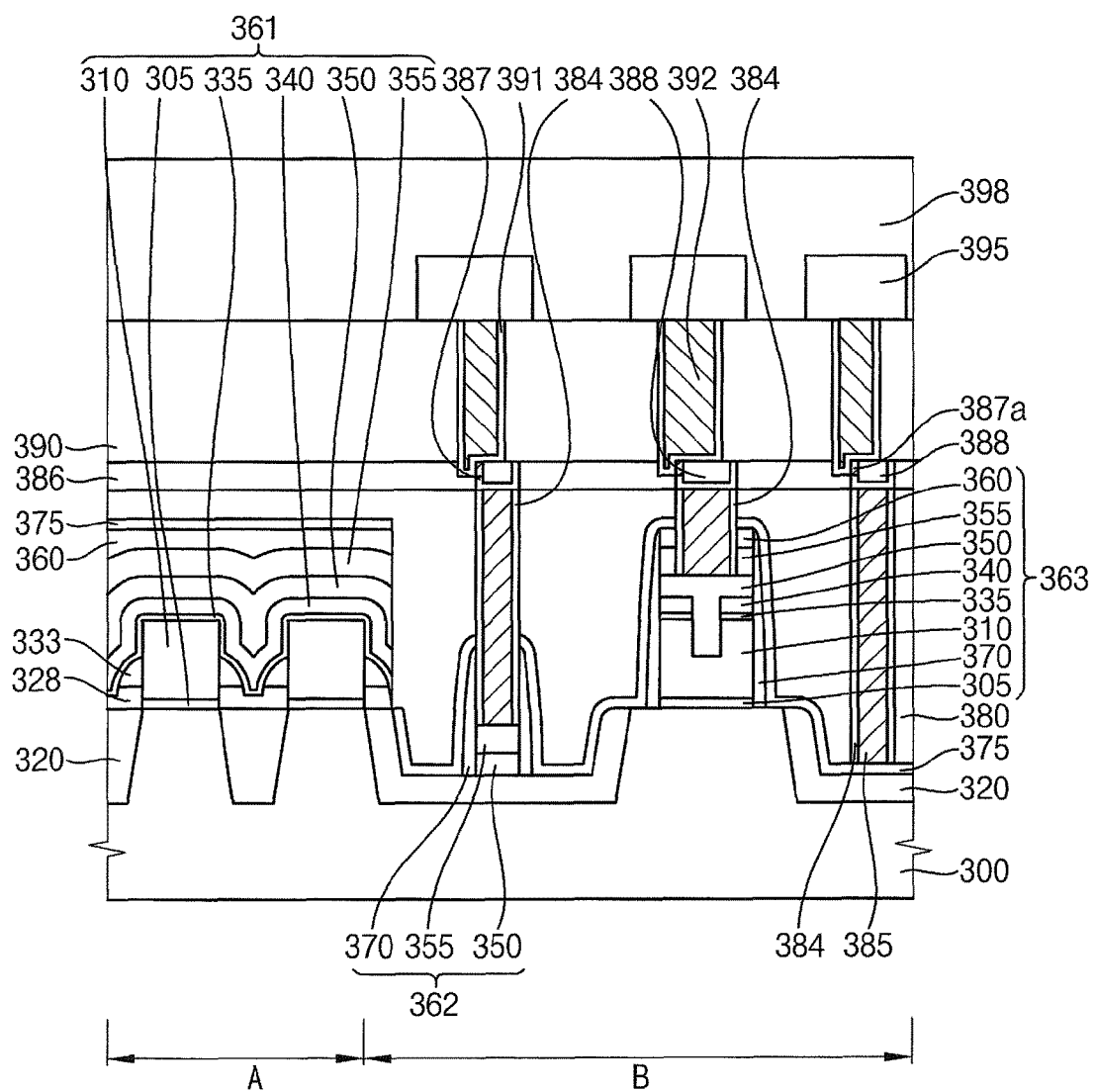

Referring to FIG. 35, a second metal wiring 395 is formed on the third insulating interlayer 390 as electrically connected to the second plug 392. The second metal wiring 395 may be formed of aluminum so as to be highly corrosion-resistant. A protection layer 398 is then formed on the third insulating interlayer 390 to cover the second metal wiring 395. Thus, a semiconductor device including a metal wiring structure fabricated in accordance with example embodiments is completed.

Various electronic devices having metal wiring structure fabricated in accordance with example embodiments will next be described with reference to FIGS. 36 to 38.

Figure 36:
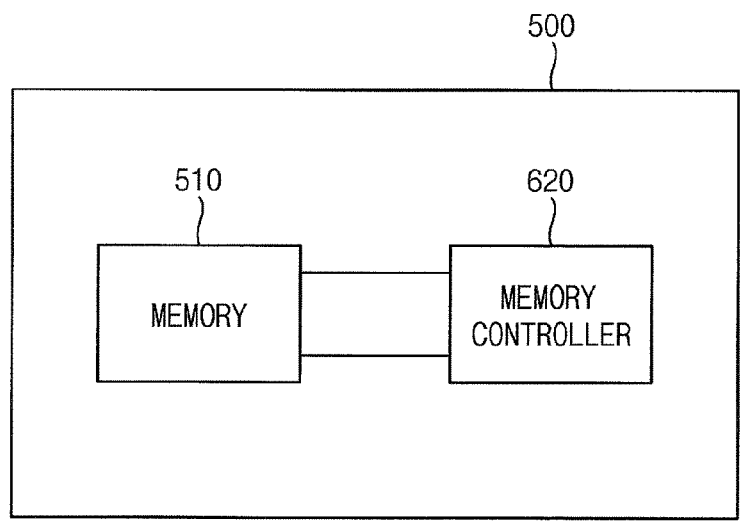
FIGS. 36 to 38 are each a block diagram of an electronic device having a metal wiring structure fabricated in accordance with example embodiments.

FIG. 36 illustrates a memory card 500. The memory card 500 includes a memory controller 620 connected to a memory 510. The memory 510 may be a flash memory (an NAND flash memory or an NOR flash memory) having metal wiring structure in accordance with example embodiments. That is, the metal wiring structure may include metal wiring, a first barrier layer surrounding the metal wiring, a plug connected to the metal wiring, and a second barrier layer surrounding the plug. A portion of the first barrier layer is nitridated so that its corrosion-resistance is increased.

The memory controller 620 provides the memory 510 with input signals to control operations of the memory 510. For example, in the memory card 500 the memory controller 620 may transfer commands of a host to the memory 510 to control input/output data and/or may control various data of a memory based on an applied control signal. In addition to a simple memory card, the present invention may be applied to other digital devices which include a similar operative association between a memory and a memory controller.

Figure 37:
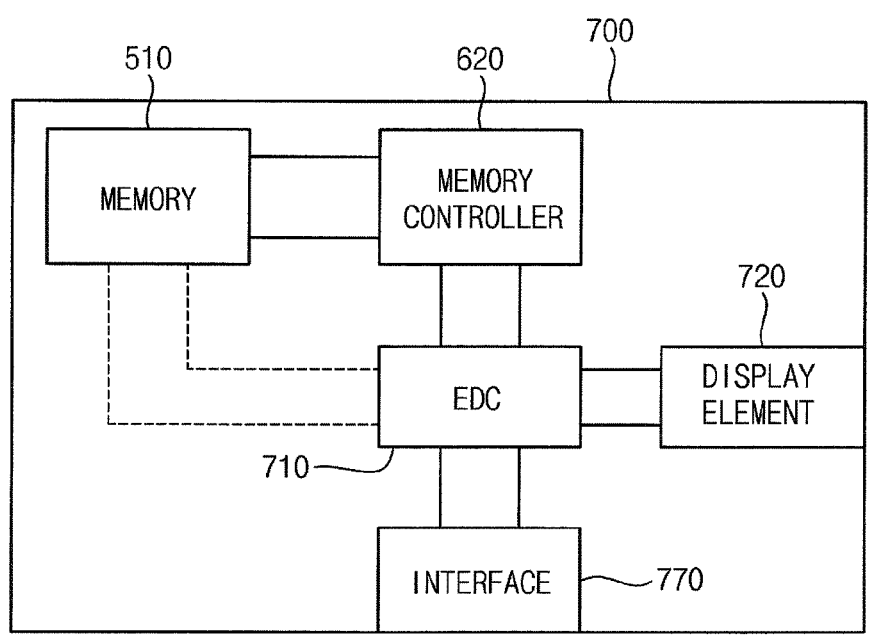

For example, FIG. 37 illustrates a portable device 700 such as an MP3 player, a video player, or a portable multi-media player (PMP). The portable device 700 includes a memory 510 (a flash memory) having metal wiring structure according to example embodiments, and a memory controller 620 as described above. Furthermore, the portable device 700 includes an encoder/decoder (EDC) 710, a display element 720 and an interface 770. As illustrated by the dashed lines of FIG. 37, data may be directly input from the EDC 710 to the memory 510, or directly output from the memory 510 to the EDC 710.

The EDC 710 encodes data to be stored in the memory 510. For example, the EDC 710 may execute encoding for storing audio data and/or video data in the memory 510 of an MP3 player or a PMP player. Furthermore, the EDC 710 may execute MPEG encoding for storing video data in the memory 510. The EDC 710 may include multiple encoders to encode different types of data depending on their formats. For example, the EDC 710 may include an MP3 encoder for encoding audio data and an MPEG encoder for encoding video data.

The EDC 710 may also decode data being output from in the memory 510. For example, the EDC 710 may decode MP3 audio data from the memory 510. Furthermore, the EDC 710 may decode MPEG video data from the memory 510. The EDC 710 may include multiple decoders to decode different types of data depending on their formats. For example, the EDC 710 may include an MP3 decoder for audio data and an MPEG decoder for video data.

The EDC 710 may include only a decoder. For example, encoded data may be input to the EDC 710, and then the EDC 710 may decode the input data and transfer the decoded data to the memory controller 620 or the memory 510.

The EDC 710 may receive data to be encoded or data being encoded by way of the interface 770. The interface 770 may be compliant with standard input devices, e.g. FireWire, or a USB. That is, the interface 770 may include a FireWire interface, an USB interface or the like. Data is output from the memory 610 by way of the interface 770.

The display element 720 may display to an end user data output from the memory 510 and decoded by the EDC 710. For example, the display element 720 may be an audio speaker or a display screen.

Figure 38:
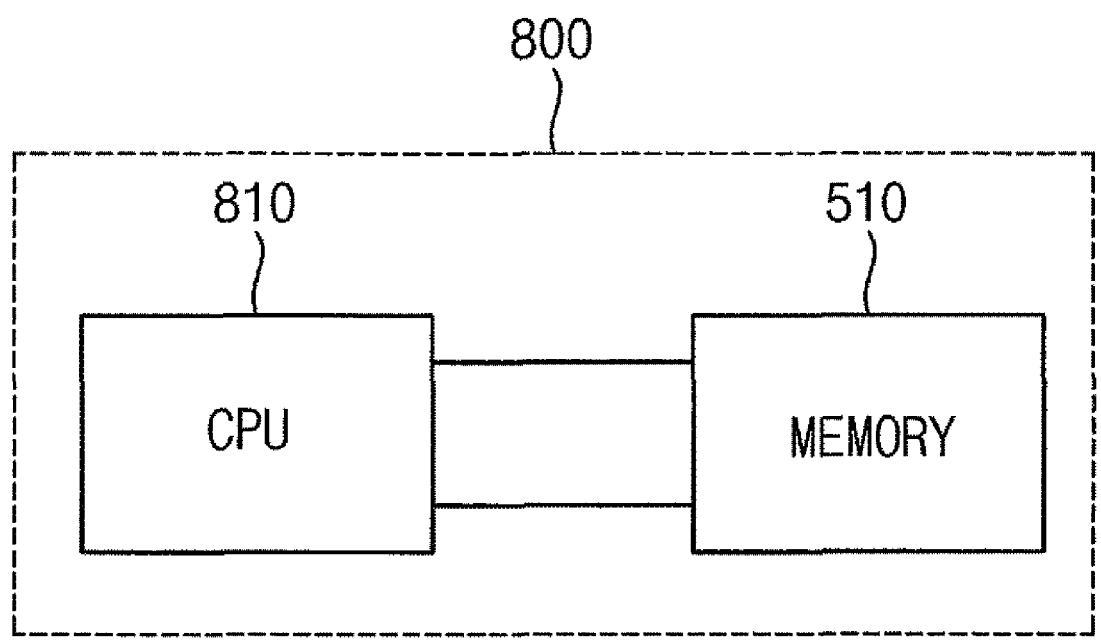

FIG. 38 illustrates a computer 800 having metal wiring according to example embodiments. The computer 800 includes a memory 510 and a central processing unit (CPU) 810 connected to the memory 510. The memory 510 may be a flash memory having metal wiring structure in accordance with example embodiments. An example of such a computer 800 is a laptop computer including a flash memory as its main memory. The memory 510 may be directly connected to the CPU 810, or indirectly connected to the CPU 810 by buses. The computer 800 may have other conventional auxiliary devices (not illustrated in FIG. 38).

According to example embodiments as described above, a first barrier layer extending around metal wiring is nitidated. Thus, even though a normally corrosive (to metal) gas such as fluorine is generated when a second barrier layer surrounding a plug connected to the metal wiring is formed, the first barrier layer will not react with fluorine. That is, corrosion of the first barrier layer is prevented.

Finally, although the present invention has been described with reference to the preferred embodiments thereof, the present invention may be embodied in other ways. Therefore, it is to be understood that the foregoing description is illustrative of the present invention and that the present invention is not limited to the specific embodiments disclosed. Rather, other embodiments and modifications of the disclosed embodiments may fall within the true spirit and scope of the invention as defined by the appended claims.

What is claimed is:

1. A method of manufacturing a metal wiring structure, the method comprising:
    forming a first barrier layer and a first metal wiring having sides surrounded by the first barrier layer, on a substrate;
    forming an insulating interlayer over the first metal wiring and the first barrier layer;
    forming a hole in the insulating interlayer that exposes at least a portion each of the first metal wiring and the first barrier layer;
    nitridating the exposed portion of the first barrier layer by creating a plasma using a source gas containing nitrogen, and treating the exposed portion of the first barrier layer with the plasma;
    subsequently forming a second barrier layer on surfaces that delimit the bottom and sides of the hole; and
    filling the hole with electrically conductive material to thereby form a plug in the hole.

2. The method of claim 1, further comprising forming a second metal wiring connected to the plug.

3. The method of claim 1, wherein the first metal wiring is formed of a metal selected from the group consisting of copper, aluminum, gold, and silver.

4. The method of claim 3, wherein the first metal wiring is formed of copper, and the first barrier layer is formed of titanium nitride or tantalum nitride.

5. The method of claim 1, wherein the first barrier layer is formed by a chemical vapor deposition (CVD) process or an atomic layer deposition (ALD) process.

6. The method of claim 1, wherein the plug is formed of tungsten, and the second barrier layer is formed of tungsten nitride.

7. The method of claim 6, wherein the second barrier layer is formed by an atomic layer deposition (ALD) process, a sequential flow deposition (SFD) process, or a pulsed nucleation layer (PNL) process.

8. The method of claim 6, wherein the second barrier layer is formed by a process using a source gas including tungsten hexafluoride and ammonia.

9. The method of claim 8, prior further comprising cleaning the exposed portion of the first barrier layer using argon and hydrogen.

10. The method of claim 1, wherein the nitridating comprises forming plasma of nitrogen and hydrogen, and treating the exposed portion of the first barrier layer with the plasma.

11. The method of claim 1, wherein the nitridating is also carried out on the first metal wiring.

* * * * *